United States Patent [19]
Honjo et al.

[11] Patent Number: 5,430,292
[45] Date of Patent: Jul. 4, 1995

[54] PATTERN INSPECTION APPARATUS AND ELECTRON BEAM APPARATUS

[75] Inventors: Ichiro Honjo; Kenji Sugishima; Masaki Yamabe, all of Kawasaki, Japan

[73] Assignee: Fujitsu Limited, Kanagawa, Japan

[21] Appl. No.: 134,860

[22] Filed: Oct. 12, 1993

Related U.S. Application Data

[63] Continuation of Ser. No. 897,451, Jun. 10, 1992, abandoned.

[30] Foreign Application Priority Data

| Jun. 10, 1991 | [JP] | Japan | 3-137692 |
| Sep. 20, 1991 | [JP] | Japan | 3-241549 |
| Nov. 14, 1991 | [JP] | Japan | 3-298838 |
| Nov. 29, 1991 | [JP] | Japan | 3-316676 |

[51] Int. Cl.$^6$ .................................. H01J 37/29
[52] U.S. Cl. .................. 250/310; 250/397; 250/492.2
[58] Field of Search ............ 250/396 R, 397, 398, 250/492.2

[56] References Cited

U.S. PATENT DOCUMENTS

| 3,921,022 | 11/1975 | Levine | 313/309 |
| 3,935,500 | 1/1976 | Oess et al. | 313/495 |
| 3,998,678 | 12/1976 | Fukase et al. | 156/3 |
| 4,068,123 | 1/1978 | Kokubo | 250/310 |
| 4,177,379 | 12/1979 | Furukawa et al. | 250/397 |
| 4,409,487 | 10/1983 | Kuschel | 250/396 R |
| 4,420,686 | 12/1983 | Onoguchi et al. | 250/310 |
| 4,498,952 | 2/1985 | Christensen | 156/643 |
| 4,663,559 | 5/1987 | Christensen | 313/310 |
| 4,868,394 | 9/1989 | Fukuhara et al. | 250/397 |
| 4,896,045 | 1/1990 | Okunuki et al. | 250/396 R |
| 4,897,552 | 1/1990 | Okunuki et al. | 250/397 |
| 4,902,898 | 2/1990 | Jones et al. | 250/492.2 |
| 4,983,830 | 1/1991 | Iwasaki | 250/309 |
| 5,061,856 | 10/1991 | Frosien et al. | 250/397 |
| 5,122,663 | 6/1992 | Chang et al. | 250/397 |
| 5,144,142 | 9/1992 | Fueki et al. | 250/396 R |
| 5,173,634 | 12/1992 | Kane | 315/58 |

FOREIGN PATENT DOCUMENTS

| 0289278 | 11/1988 | European Pat. Off. |
| 0339951 | 11/1989 | European Pat. Off. |
| 0379865 | 9/1990 | European Pat. Off. |
| 2220871 | 10/1974 | France |

(List continued on next page.)

OTHER PUBLICATIONS

K. Kuroda et al., "Three-anode accelerating lens system for the field emission scanning electron microscope," Journal of Applied Physics, vol. 45, No. 5, May 1974, pp. 2336–2342.

(List continued on next page.)

Primary Examiner—Bruce C. Anderson
Attorney, Agent, or Firm—Staas & Halsey

[57] ABSTRACT

A pattern inspection apparatus is designed to quickly and accurately perform an inspection of an inspecting sample, such as masks, wafers or so forth by irradiating electron beams onto the inspection sample and detecting a secondary electron or a backscattered electron reflected from the surface of the inspecting sample or a transmission electron passing through the inspection sample. The pattern inspection apparatus includes an electron beam generating means including at least one electron gun for generating at least one electron beam irradiating on the surface of the inspecting sample, a movable means for supporting the inspecting sample, a detecting means including a plurality of electron detecting elements for detecting electrons containing information related to the construction of the inspection sample and a detection signal processing means for processing simultaneously or in parallel formation the outputs of the electron detecting elements of the detecting means. Also, when a plurality of electron beams are used for simultaneous irradiation of the inspecting sample, the pattern inspection apparatus is provided a mechanism for avoiding interference of a reflected beam of the adjacent electron beam.

47 Claims, 33 Drawing Sheets

FOREIGN PATENT DOCUMENTS 60-175352  9/1985  Japan .
61-42129   2/1986  Japan .
61-42130   2/1986  Japan .
61-42132   2/1986  Japan .
62-147725  7/1987  Japan .
63-269446  11/1988 Japan .
63-269526  11/1988 Japan .
63-269527  11/1988 Japan .
3-95829    4/1991  Japan .

OTHER PUBLICATIONS

E. Bassous et al., "Ink jet printing nozzle arrays etched in silicon," Applied Physics Letters, vol. 31, No. 2, Jul. 15, 1977, pp. 135–137.

L. Kuhn et al., "Silicon Charge Electrode Array for Ink Jet Printing," IEEE Transactions on Electron Devices, vol. ED-25, No. 10, Oct. 1978, pp. 1257–1260.

Hans C. Pfeiffer, "Recent Advances in Electron-Beam Lithography for the High-Volume Production of VLSI Devices," IEEE Transactions on Electron Devices, vol. ED-26, No. 4, Apr. 1979, pp. 663–674.

I. Brodie et al., "A Multiple-Electron-Beam Exposure System for High-Throughput, Direct-Write Submicrometer Lithography," IEEE Transactions on Electron Devices, vol. ED-28, No. 11, Nov. 1981, pp. 1422–1428.

T. H. Newman et al., "Dot matrix electron beam lithography," J. Vac. Sci. Technol. B, vol. 1, No. 4, Oct.–Dec. 1983, pp. 999–1002.

J. B. Lasky, "Wafer bonding for silicon-on-insulator technologies," Appl. Phys. Lett., vol. 48, No. 1, Jan. 6, 1986, pp. 78–80.

R. D. Black et al., "Silicon and silicon dioxide thermal bonding for silicon-on-insulator applications," J. Appl. Phys., vol. 63, No. 8, Apr. 15, 1988, pp. 2773–2777.

G. W. Jones et al., "Microstructures for particle beam control," J. Vac. Sci. Technol. B, vol. 6, No. 6, Nov./Dec. 1988, pp. 2023–2027.

Nikkei Sangyo Newspaper, Sep. 23, 1991, Japan.

*Patent Abstracts of Japan,* vol. 6, No. 152 (P-134) 12 Aug. 1982 & JP-A-57 072072 (Fujitsu) 6 May 1982.

*Patent Abstracts of Japan,* vol. 8, No. 88 (E-240)[1525] 21 Apr. 1984 & JP-A-59 006537 (Hitachi) 13 Jan. 1984.

*Patent Abstracts of Japan,* vol. 8, No. 99 (E-243) 10 May 1984 & JP-A-59 016255 (Nippon Denshin Denwa) 27 Jan. 1984.

Saitoh et al., "Electron beam pattern inspection system using digital image processing," *Journal of Vacuum Science and Technology: Part B,* vol. 4, No. 3, May 1986, New York, N.Y., pp. 686–691.

Spindt et al., "Physical properties of thin-film field emission cathodes with molybdenum cones," *Journal of Applied Physics,* vol. 47, No. 12, Dec. 1976, New York, N.Y., pp. 5248–5263.

Fig.1(a)
Fig.1(b)
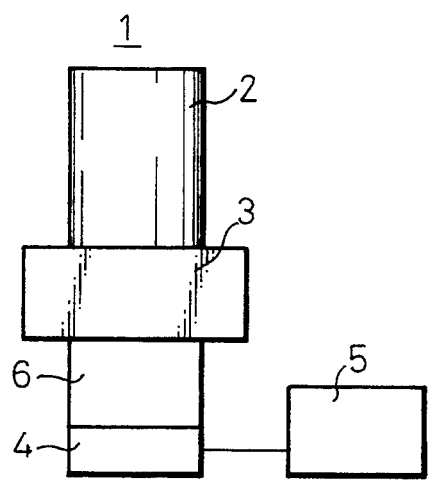
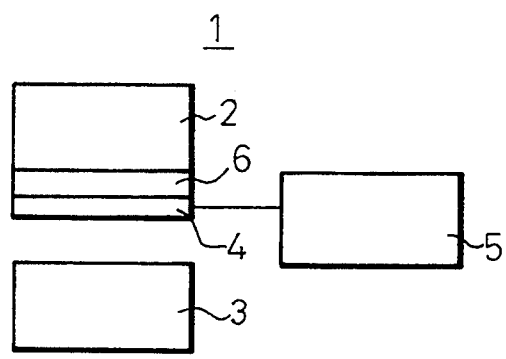
Fig. 2
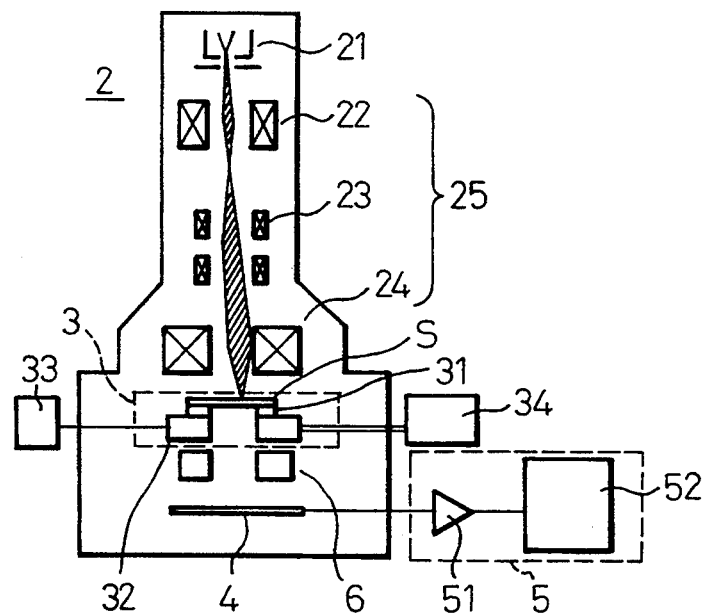

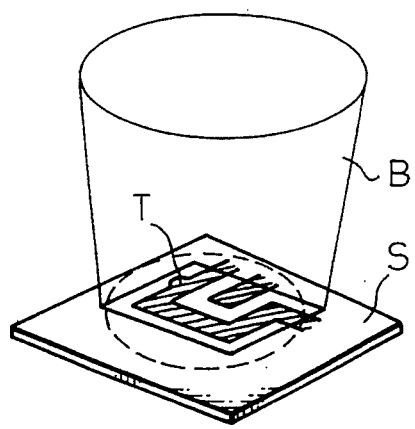
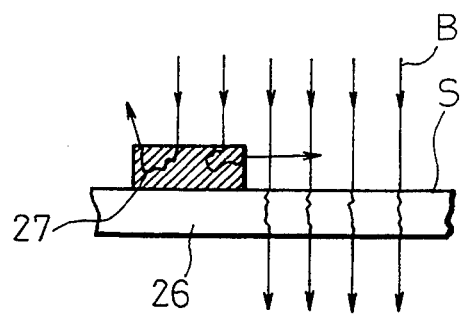
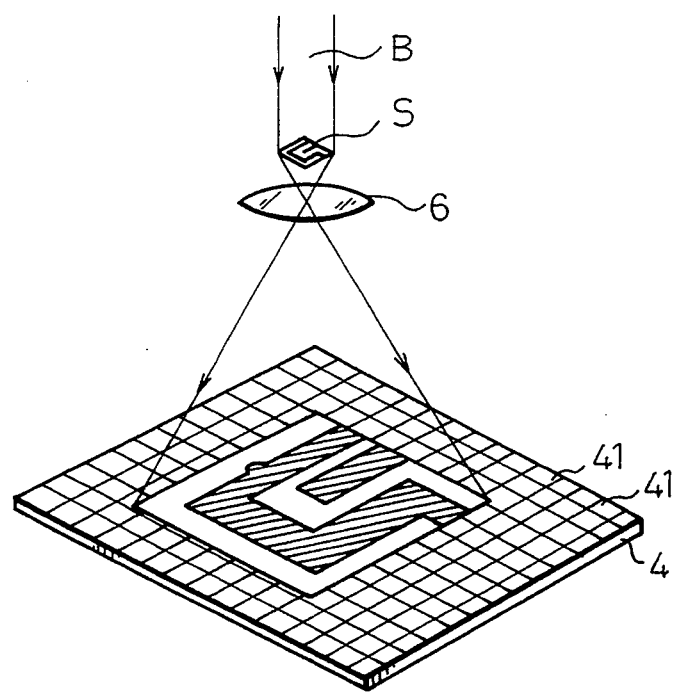

Fig. 4
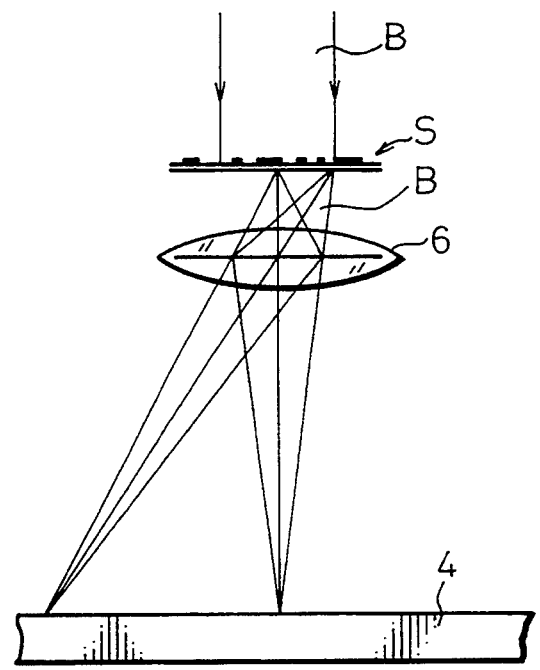
Fig. 5
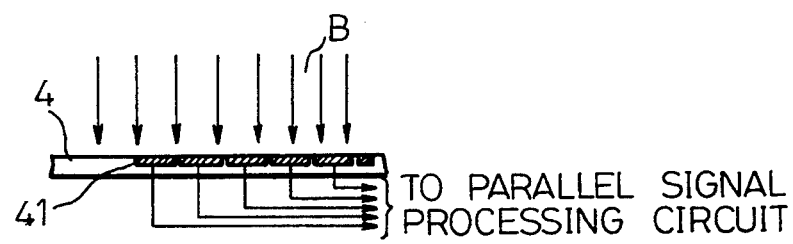
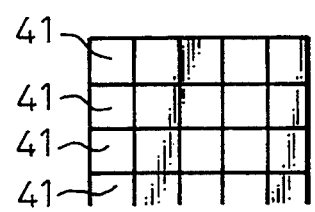

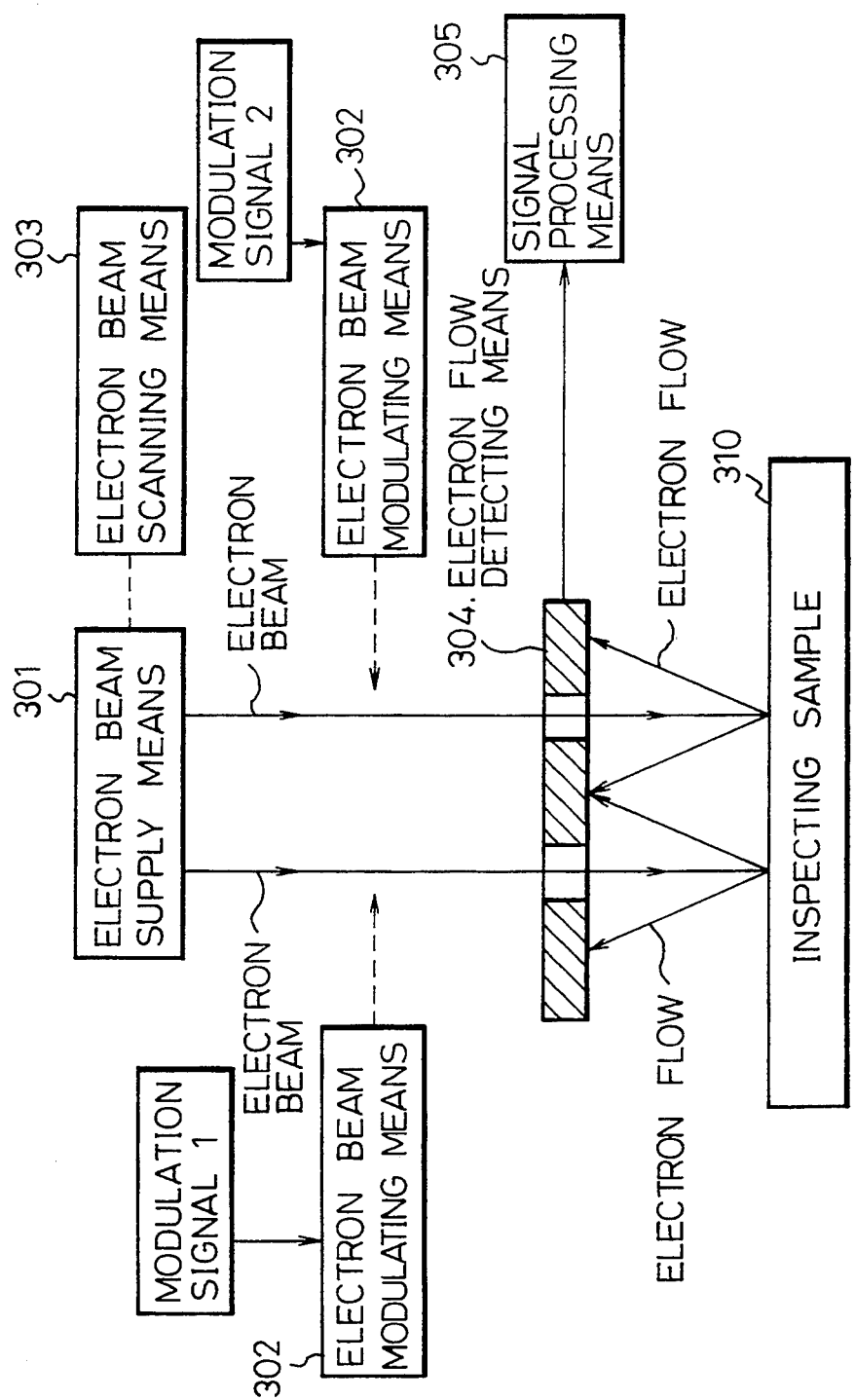

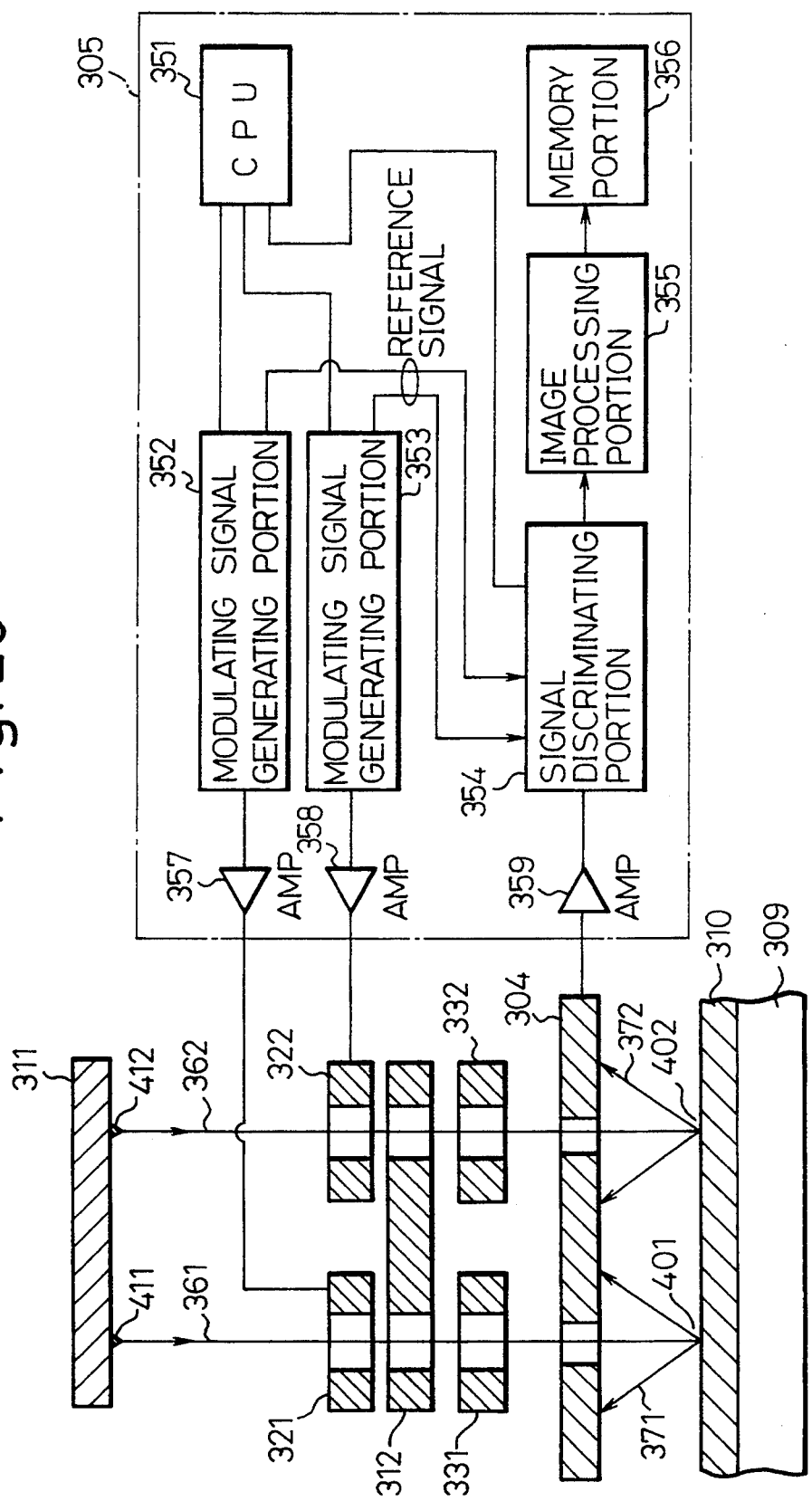

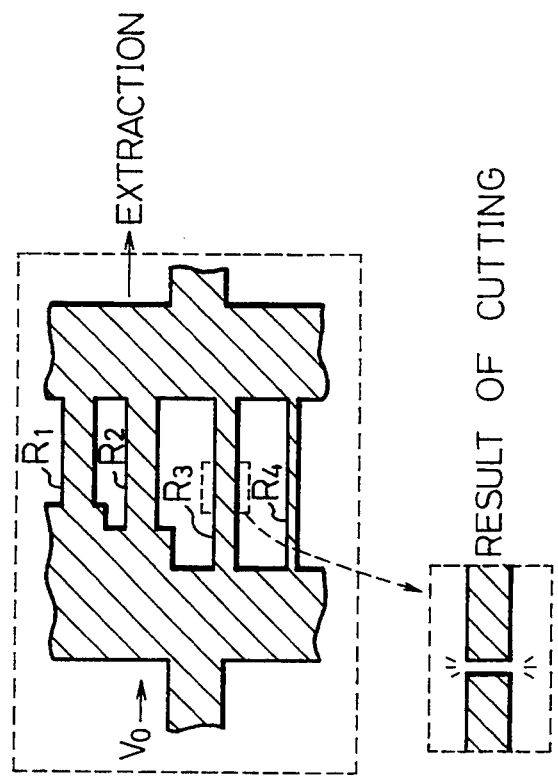
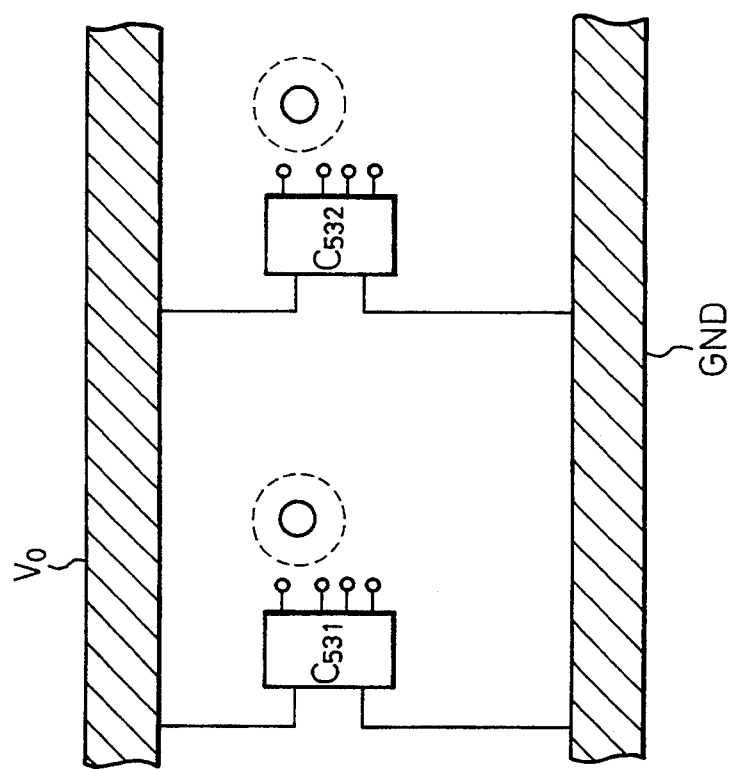

PATTERN INSPECTION APPARATUS AND ELECTRON BEAM APPARATUS

This application is a continuation, of application Ser. No. 07/897,451, filed Jun. 10, 1992, now abandoned.

BACKGROUND OF THE INVENTION

1. Field of the Invention

The present invention relates to a pattern inspection apparatus. More specifically, the invention relates to a pattern inspection apparatus for performing an inspection of a mask pattern, such as a mask, reticule or the like to be used in exposure technology for transferring a fine circuit pattern onto a semiconductor substrate or of a fine circuit pattern formed on a wafer. More specifically, the invention relates to a pattern inspection apparatus for inspecting a pattern configuration or a defect or an error in a pattern configuration of an inspection sample, such as a mask to be used for X-ray exposure technology for transferring a fine circuit pattern or the like onto a semiconductor substrate employing an X-ray beam including a synchrotron radiation beam (SOR), a wafer including a fine circuit pattern formed on a semiconductor substrate or a mask, reticule or the like to be used in light exposure technology for transferring a fine circuit pattern to a semiconductor substrate employing an ultra-violet light source.

2. Description of the Related Art

Conventionally, in order to transfer a fine circuit pattern onto a semiconductor substrate, ultra-violet light is used as a light source. Normally, a mask containing patterns for several chips is employed to perform a transfer of a compressed pattern onto a large diameter wafer by periodically shifting the transfer position on the wafer in a step-and-repeat manner. At the present time, for inspection of wafer patterns to detect foreign matter or defects on the mask pattern or to defect foreign matter on the wafer or the wafer pattern, an optical method employing an optical micrograph is frequently used. However, as the density of fine circuit patterns has become greater, it has become necessary to provide a light source with a shorter wave length for effecting wafer pattern inspection. In a conventional light source employing a conventional optical system, resolution cannot be improved because of specific diffraction limits which make it difficult to detect small defects.

To solve such a problem, electron beam inspection technology has been developed.

Thus, to facilitate the increasing density of circuit patterns, X-ray exposure technology employing an X-ray containing synchrotron radiation beam (SOR) is regarded as one of the important next age transfer technologies. Simultaneously, it is becoming necessary to shorten the wavelength of the light source used for inspection of X-ray masks.

In the prior art, the object of the inspection is to determine the presence of foreign matter adhering on the surface of the mask, reticule, wafer or the like, or to locate defects in a pattern such as the protrusion 201, intrusion 202, break 203, bridge contact 204, pin spot 205 or pin hole 206 or the like as shown in FIG. 18. The generally required sensitivity is, for example, in the case of foreign matter, for a bare wafer: (pattern dimension)×1/7 to 1/5
   for a patterned wafer: (pattern dimension)×1
   for a reticule or mask: transfer limit.

On the other hand, in the case of a pattern defect, the required sensitivity level is generally (line width)×$\frac{1}{2}$.

With increased pattern and package density, higher sensitivity becomes necessary. However, in the case of an inspection process employing a light beam, the extent to which the size of a light beam may be reduced is limited. Even when the wavelength is shortened, the highest possible sensitivity of visual light is 0.25 μm. Therefore, the size of the device to be inspected is limited to 4M to 16M DRAM. On the other hand, even when an ultra-violet light beam is employed, the maximum possible sensitivity to be achieved is 0.15 μm. In this case, the size of the device to be inspected can be up to 64M DRAM. Therefore, it is difficult to effect an inspection of a 256M DRAM or a next age device having further reduced size and greater packing density, such as a 1G DRAM.

Therefore, a method employing an electron beam in place of the light beam has been considered.

In methods employing electron beams, fewer problems will result from increasing the pattern density and thus higher density patterns can be achieved than with a light beam.

However, in prior art electron beam processes, there is a problem in that the information detected by a detecting means is processed independently in a time sequence in a detecting process and therefore, a relatively long data processing period is required.

In addition, as set forth above, when circuit pattern and package density are increased, the amount of data to be processed during pattern inspection of the device is naturally increased. Therefore, it is required to provide a greater capacity for accepting data to be arithmetically processed.

For example, there is a tendency to require a process for (1 cm/0.1 μm)$^2$=100 M pixel/cm$^2$, 8″ wafer, 31G pixel/wafer.

In contrast, when the density of the circuit pattern is increased, the size of the pattern unit for processing to check whether a defect is present or not becomes small. In addition, the capacity of the individual chip is increased. Therefore, where there is an increase in circuit pattern density, the amount of information to be processed for inspection rapidly increases. In conventional electron beam systems, a single electron beam is scanned across the mask in order to detect generated secondary, backscattered or transmitted electrons. Therefore, the signal stream from the irradiating region of an electron beam having high convergence for detecting very small defects, is generated continuously in a time sequence. A long time period is thus required for the transmission of the image information to a signal processing system. Therefore, even when the speed of the signal processing system is increased, a long time period is still required for inspection.

In a pattern inspection process employing an electron beam, the electron beam is irradiated onto an inspection sample, such as a mask or wafer or the like and the beam is scanned across the sample in order to generate an electron flow at the irradiated portion and introduce such electron flow into an electron detecting portion. The electron flow introduced into the detecting portion contains configuration information relating to the pattern. The signal contained in the electron flow provides time sequential pattern information.

The electron flow to be introduced into the detecting portion from the irradiated portion of the inspection sample may include secondary electrons which vary in quantity as function of the direction of incidence to the detecting portion depending upon the configuration of the inspection sample, backscattered electrons which vary in amount depending upon the material and configuration of the inspection sample or transmitted electrons which vary in amount depending upon the pattern of the inspection sample when the latter is a thin film mask or an X-ray mask or the like. From these respective electrons, the plane configuration and three dimensional configuration, such as projections and recesses and the like of the sample, can be recognized.

However, as set forth above, methods employing electron beams present problems in that the inspection speed is slow requiring a long processing period.

SUMMARY OF THE INVENTION

It is an object of the present invention to solve the problems in the prior art and thus provide a pattern inspection apparatus that can detect defects in circuit patterns on inspection samples, such as masks or wafers or the like, by scanning at least one electron beam on the inspection sample and using secondary or backscattered electrons from the inspection sample or electrons transmitted through the sample with high sensitivity and high process speed, and thus has a large capacity for information and a high processing speed for processing the pattern of masks or wafers or the like having high density circuit patterns and high package density.

According to the present invention, there is provided a pattern inspection apparatus which comprises:

an electron beam generator including an electron gun for generating at least one electron beam which is accelerated and converged into a predetermined diameter and irradiated onto an inspection sample;

a movable support for supporting the inspection sample;

a detector unit including a plurality of electron detecting elements arranged on a plane for detecting electrons containing construction information relating to the inspection sample; and a signal processor for processing information output from said electron detecting elements simultaneously or in parallel.

With the construction set forth above, the present invention can detect a fine pattern on a mask, wafer or the like with high accuracy. Also, according to the present invention, the electrons transmitted through the sample or generated from the surface of the sample, and which contain information concerning the structure predetermined portions of the pattern, can be processed simultaneously or in parallel to contribute to the shortening of the process period.

BRIEF DESCRIPTION OF THE DRAWINGS

The present invention will be more fully understood from the detailed description set forth below and from the accompanying drawings of the preferred embodiments of the invention, which, however, should not be taken to be limitative to the invention but are for explanation and understanding only.

In the drawings:

FIGS. 1(a) and 1(b) are schematic block diagrams showing practical embodiments of a pattern inspection apparatus according to the present invention;

FIGS. 3(a) to 3(c) are illustrations showing the principles of pattern inspection when the pattern inspection apparatus of FIG. 2 is employed;

FIG. 4 is an illustration showing the principles of pattern inspection when the pattern inspection device illustrated in FIG. 2 is employed;

FIG. 5 is a schematic illustration showing the construction of a detector 4 to be employed in the pattern inspection apparatus according to the invention;

FIG. 19 is a block diagram showing the principles of operation of a pattern inspection apparatus according to the invention;

FIG. 20 is a block diagram showing a first embodiment of the pattern inspection apparatus of the invention;

FIGS. 30(a) and 30(b) are schematic views showing the details of the major components of a circuit $C_i$ with a plan view including the circuit $C_i$;

FIGS. 42(a) to 42(c) are illustrations showing an embodiment of the pattern inspection apparatus in which FIG. 42(a) is a fragmentary illustration showing a concept of the embodiment, FIG. 42(b) is a plan view of a mask formed with openings and FIG. 42(c) is a graph for identifying a portion of the mask having an opening.

DESCRIPTION OF THE PREFERRED EMBODIMENT

Figure 6:
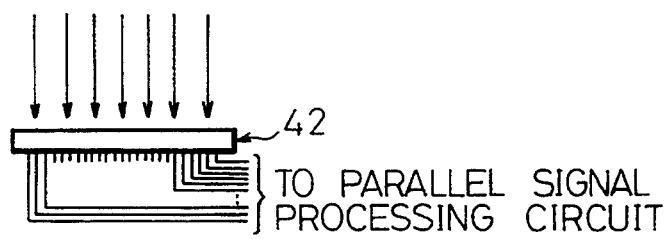
FIG. 6 is a schematic illustration of another construction of a detector 4 to be employed in the pattern inspection apparatus according to the invention.

A preferred embodiment of a pattern inspection apparatus according to the present invention will be discussed herebelow in detail with reference to the accompanying drawings. FIG. 1(a) provides a brief illustration of one embodiment of the pattern inspection apparatus according to the present invention.

FIG. 1(b) provides a brief illustration of another embodiment of the pattern inspection apparatus according to the invention.

In both of the embodiments of FIGS. 1(a) and 1(b), a pattern inspection device 1 comprises an electron beam generator 2 having an electron gun for generating at least one electron beam that is accelerated and converged into a predetermined diameter for irradiating an inspection sample, a movable support 3 for supporting the inspection sample, a detector 4, which includes a plurality of electron detecting elements for detecting the electron containing information associated with the construction of the inspection sample arranged in alignment, and a detection signal processor 5 for processing information output from respective electron detecting elements of the detector 4 simultaneously or in parallel formation.

FIG. 1(a) is basically designed for an inspection of a circuit pattern by transmitting an electron beam through the inspection sample, such as a mask or the like. On the other hand, the apparatus of FIG. 1(b) is basically adapted to use secondary or backscattered electrons generated in the inspection sample by irradiating the electron beam onto an inspection sample, such as a wafer, for performing an inspection.

A discussion of the electron beam generator 2 to be employed in the preferred embodiment of the pattern inspection apparatus according to the present invention follows. As set forth above, conventional methods employing a light beam have limited resolution due to diffraction effects, and therefore, such methods are not suitable for pattern inspection of masks or wafers or the like having high circuit pattern density and high package density. In contrast to this, according to the present invention, an electron beam of charged particles is basically employed. In addition, in the illustrated embodiments of the pattern inspection apparatus according to the present invention, the electron beam generator 2 is designed to generate a highly converged electron beam.

An example of the electron beam generator 2 comprises an electron gun 21, and an electron optical system 25 including an electromagnetic lens 22, a deflector 23 and an electromagnetic lens 24.

In the drawings, the movable support 3 comprises a sample stage 31 for supporting an inspection sample S, such as a mask or the like, an XY stage drive mechanism 32 for shifting the sample stage 31 horizontally in one dimensional or two dimensional directions, and a laser interferometer 33, for example, for detecting the position of the sample stage 31 and generating a control information signal.

Figures 1, 43A:
FIGS. 43(a) to 43(d) are illustrations showing wave forms used in a modulation method in another embodiment of the present invention.
Figures 2, 43A:
FIG. 2 is a fragmentary cross-sectional view of one embodiment of the pattern inspection apparatus of the invention.

As shown in FIG. 2, a detector 4 composed of a plurality of electron detecting elements is provided beneath the movable support 3. The detector 4 is designed to receive a plurality of electron beams and to process the same simultaneously or in parallel formation. The output of the detector 4 is processed by a detection signal processor 5 that comprises an amplifier 51 and a signal processing circuit 52.

In a conventional method for fabricating a circuit pattern T on a wafer or the like, a single electron beam is employed so that the electron beam, which is finely focused by means of an appropriate electromagnetic optical system, is irradiated onto the wafer and scanned along the intended pattern T so as to form an image of the pattern T.

In contrast, the present invention employs an electron beam for performing an inspection to check whether a circuit pattern has been correctly drawn. Therefore, in the electron optic system 25 of FIG. 2, the electron beam from the electron gun 21 is converged by a converging lens 22, such as an electromagnetic lens or the like, into a predetermined beam size, and then the converged beam may then be irradiated onto random positions in a certain region of the mask by means of the deflector 23. Therefore, an appropriately converged electron beam is irradiated onto a given region of the circuit pattern as shown in FIG. 3a. According to the present invention, the beam diameter of the electron beam is adjusted by the electron optic system 25 so that the given region of an inspection sample can be irradiated uniformly.

As shown in FIG. 3b, in the X-ray mask or the like, the substrate 26 is a thin film made of a material containing elements having a relatively small atomic weight, such as SiC. On such substrate 26, an absorber 27 made of a material containing an element having a relatively large atomic weight, such as gold or tantalum is patterned for absorbing X-rays. When the electron beam is irradiated onto such mask S, the portion of the electron beam B irradiated on the absorber 27 is scattered by the heavy elements thereof so that the electrons of the beam do not pass through the mask and the same are not significantly scattered. On the other hand, the substrate 26 is in the form of a thin film having a thickness of about 1 µm, and very little scattering of the irradiated electron beam occurs. Therefore, the width of the scattered electron beam remains sufficiently small so that most of the electrons pass through the substrate 26.

Accordingly, as shown in FIGS. 3(c) and 4, only those electrons which are transmitted through the substrate 26 form the expanded image on the detector 4 using an appropriate electron optic system 6. Since transmitted electrons are detected, dust, which does not significantly effect X-rays and is detected as a defect when conventional methods for detecting secondary or backscattered electrons are used, permits the electron beam to pass without absorbing a significant part thereof so as not to produce a detection error signal in the prior art.

As set forth above, according to the present invention, the electron beam B generated in the electron beam generator 2 and thereafter shaped is irradiated onto the inspection sample S, such as a mask or the like. Then, the transmitted electrons containing two dimensional information of the inspection sample are projected onto the detector 4 through the electron optic system 6 to form the pattern image T on the detector 4.

On the other hand, in the detector employed in the embodiment of the pattern inspection apparatus as shown in FIG. 5, a plurality of electron detecting elements 41, such as semiconductor detecting elements formed by PN junction elements, are arranged in horizontal alignment in one or two dimensional directions. Each of the electron detecting elements receives an electron beam transmitted through an inspection sample S and generates an electric signal corresponding to the intensity of the electron beam.

On the other hand, as the detector 4, a channel plane 41, such as that illustrated in FIG. 6, can also be employed.

In this case, the electrons entering the channel are boosted to enhance S/N ratio. As set forth above, the mask pattern thus formed can be obtained as a two dimensional image.

The detection signals are generated by the detector 4 are processed, such as by binarization, simultaneously or in parallel formation, by the signal processing portion 5 and transmitted to a memory section (not shown) or the like and stored therein as digital image signal. Subsequent processing following the image processing is similar to that performed in a conventional mask inspection apparatus. Namely, such processing is done by comparing the image information of the same pattern of two chips to detect a difference therebetween to determine the presence of a defect. As an alternative, the defect can be detected by comparing obtained data with design data.

Figure 7:
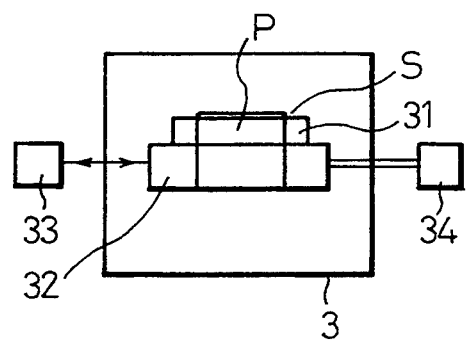
FIG. 7 is a diagram showing an example of a construction of a movable support 3 to be employed in the pattern inspection apparatus of the invention.

It should be noted, that in the movable support 3 of the present invention, as shown in FIG. 7 for example, the inspecting sample S, such as a mask or the like, is fixed to the sample stage 31. The sample stage 31 is rigidly fixed to an XY stage 32. For sample stage 31 and the XY stage 32, openings P are formed for allowing electrons to pass therethrough. The XY stage 32 is designed to be driven by means of an external driving motor 34 through a ball screw or the like.

The foregoing discussion has been provided for the case in which the inspection sample to be subjected to pattern inspection is a mask or the like, which permits the electron beam to pass therethrough. However, the present invention can be equally implemented for the case in which the inspection sample S is a wafer or reticule having a substrate with a thickness of several mm and thus does not permit the electron beam to be transmitted therethrough by using secondary electrons.

In such a case, as shown in FIG. 1b, the detector 4 is disposed between the movable support 3 supporting the inspection sample S and the electron beam generator 2. Other constructions should be understood as equivalent to those of the embodiment of FIG. 1a.

In such a case, the electron detecting elements 41 of the detector 4 are of course directed toward the movable support 3.

Furthermore, in the above-mentioned two examples of the present invention, the electron beam B generated by the electron beam generator 2 may be scanned on the inspecting sample S appropriately by means of the deflector. Such construction may be combined with the movable support 3 so that the predetermined pattern T can be rapidly detected with high sensitivity for small defects and high accuracy.

Figure 8:
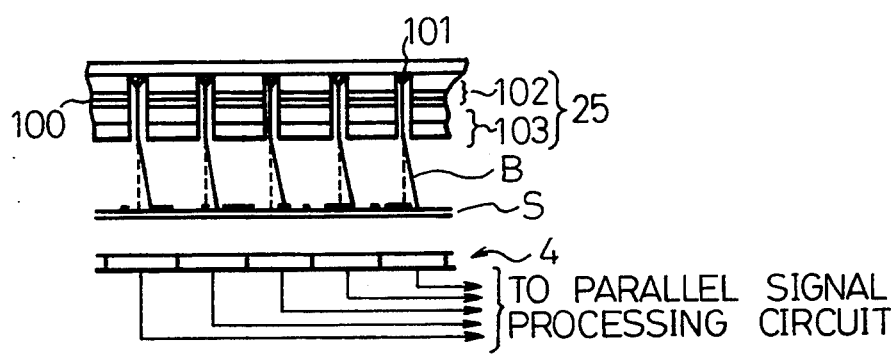
FIG. 8 in a diagram showing an example of an electron beam generator 2 to be employed in the pattern inspection apparatus of the invention.

In order to satisfy the requirement for processing a large amount of data for efficiently inspecting the inspection samples S, such as a mask or a wafer or the like, having high circuit density and high package density, it becomes necessary to use a plurality of electron beam generating units. An embodiment employing a plurality of electron beam generating unit 25 is illustrated in FIG. 8. As can be seen, multi-construction of the electron beam generator 2 employed in the embodiment in FIG. 8 has a construction such that the electron beam generator 2 per se is divided into a plurality of sub-devices 25; each sub-device 25 including at least an electron emitter 101, a converging electrode 102, and a deflection electrode 103 formed in a laminated construction.

The electron beam generator 2 in FIG. 8 has a silicon substrate 100. In the silicon substrate, an electron emitter section 101 of silicon or hexagonal boron lanthanum is formed. On the same or separate silicon substrates, a plurality of silicon oxide ($SiO_2$) layers and a polycrystalline silicon layer are appropriately formed and the converging electrode 102 and the deflection electrode 103 are formed together with holes for passing electrons using fine processing technology. Then, the sub-assemblies thus formed are combined to obtain a multi-construction electron beam generator 2 which includes a plurality of individual electron beam generating units 25.

The electron beams generated by the respective units 25 of the electron beam generator means 2 of the FIG. 8 embodiment have identical diameters and the same are adapted to uniformly irradiate predetermined areas of a plurality of regions on the inspection sample S.

In order to implement the pattern inspection apparatus according to the invention in a practical sense, it is, of course, possible to use the electron beam generator 2 of FIG. 2, which generates a single electron beam. However, in view of efficiency of inspection, it is preferred to employ an electron beam generator 2 as illustrated in FIG. 8 which includes a plurality of beam generating units 25.

When a beam generator 2 having a plurality of the electron beam generating units is employed, such electron beam generating units can be arranged in a single dimensional direction or in two dimensional directions.

It should be appreciated that the number of rows or columns and the arrangement pattern of the plurality of electron beam generating units are not specified and can be determined in any number and any pattern depending upon intended application.

Figures 9A, 9B:
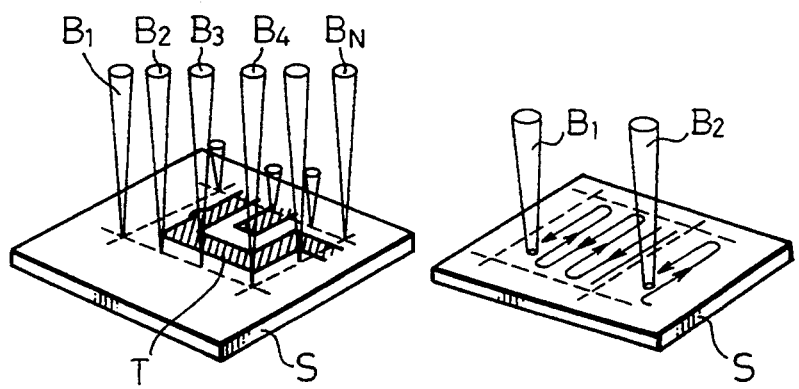
FIGS. 9(a) and 9(b) are illustrations showing the irradiating electron beam conditions when the electron beam generator 2 of FIG. 8 is employed.

Particularly, as shown in FIG. 9a, on the circuit pattern T formed on the inspection sample S, a plurality of electron beams B1, B2, B3, B4 . . . Bn are irradiated simultaneously so that respective electron detecting elements 41 of the detector 4 may detect the transmitted electrons or backscattered secondary electrons. Therefore, by employing the multi-construction electron beam generator 2, a fine and large amount of pattern information can be quickly and accurately obtained for enhancing efficiency of inspection.

On the other hand, when a plurality of the electron beam generating units 25 are employed, each individual electron beam generating unit 25 may be designed to scan its respective electron beam B1, B2, . . . over a predetermined region by the deflection electrode 103.

By employing such a construction to permit scanning of the electron beam, it becomes possible to enable quick inspection for any configuration of circuit pattern on the inspection sample S by using scanning of the electron beam in combination with horizontal shifting of the movable support 3.

Figures 10A, 10B:
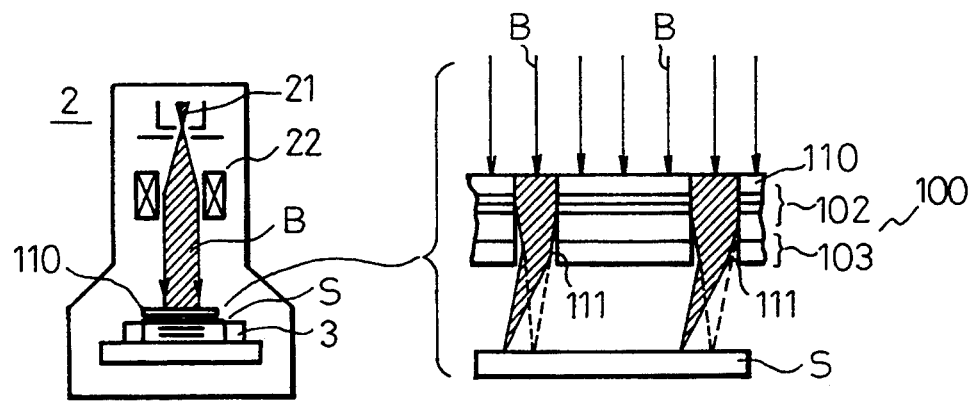
FIG. 10(a) is a side elevational view showing the overall construction of another example of an electron beam generator 2 employed in the pattern inspection apparatus according to the invention.
FIG. 10(b) is a partial enlarged view of the generator of FIG. 10(a)

In order to positively form a plurality of electron beams B, another construction of the electron beam generating means 2 as illustrated in FIGS. 10(a) and 10(b) can be employed.

In the embodiment of FIGS. 10(a) and 10(b), a fine construction substrate 110 includes a converging electrode 102 and a deflection electrode 103. The electron emitter 101 for use as an electron gun is omitted. As shown in FIG. 10(a), the fine construction substrate 110 is disposed between an electron beam generator 2 composed of an electron gun 21 and an optical system 22 and the movable support 3. Then, an electron beam injected from the electron gun 21 and having an uniform diameter formed by the optical system 22 is caused to pass through a predetermined number of electron beam passing holes 111 having predetermined configurations so that a plurality of electron beams are irradiated simultaneously on the surface of the inspection sample S.

In addition, by respectively controlling the deflection of the individual electron beams passing through the electron beam passing holes 111 by the converging electrode 102 and the deflection electrode 103, a plurality of regions on the inspection sample can be scanned simultaneously.

In the method set forth above, part of the circuit pattern on the inspection sample S can be inspected at one time. By using the deflector for scanning the electron beam in combination with the operation of the movable support 3, the area to be inspected during a single inspecting operation can be expanded.

Therefore, in accordance with the present invention, after inspection of one part of the region of the pattern T on the inspection sample S is completed, the movable support 3 is shifted by means of the XY stage 32 to shift the irradiating region of the electron beam.

Figure 11:
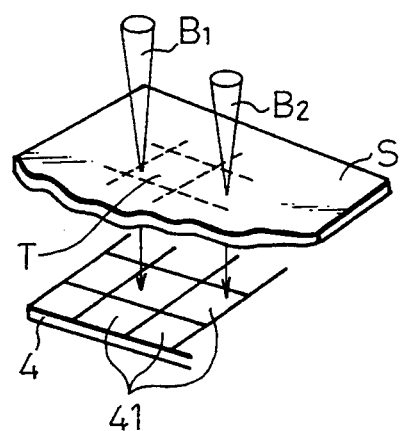
FIG. 11 is an illustration showing an example of an inspection process employing a plurality of electron beams generated by the electron beam generator 2 of the invention.

As shown in FIG. 11, the detectors 4 have a size corresponding to a small region. In each region, the electron detecting elements 41 of the detector 4 detect the presence and absence of the transmitted electrons in synchronism with the scanning of the electron beam to obtain pattern information from respective positions on the mask.

Figure 12:
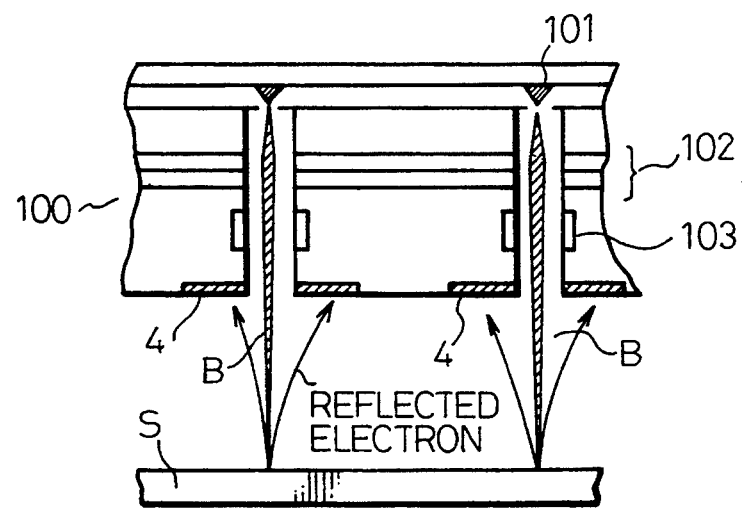
FIG. 12 is an illustration showing an example of the construction of an electron beam generator 2 and detector 4 used for detecting backscattered or secondary electrons.

FIG. 12 shows the pattern inspection apparatus according to the present invention, which is designed for detecting secondary electrons or backscattered electrons from a mask or wafer on which the electron beam is irradiated. In the shown construction, the detector 4 has a plurality of electron detecting elements 41 formed in the substrate 100, on which the electron beam generator 2 is provided.

In the method of pattern inspection according to the present invention, each of the electron detecting elements 41 is coupled with a corresponding electron beam so as to detect the secondary electrons or the backscattered electrons from the irradiating position of the corresponding electron beam. Since the electron beams and the electron detecting elements 41 are driven integrally, the secondary electrons or the backscattered electrons from an adjacent beam will be detected as mere noise. Therefore, degradation of a S/N ratio due to scattering of an adjacent electron beam does not occur. The detection signal from each detecting element 4 is transmitted to the signal processing section and subjected to parallel image processing, such as binarization. The resultant digital image signal is stored in the memory section. The image processing to be subsequently performed is similar to that performed in a conventional inspection apparatus.

Figure 13:
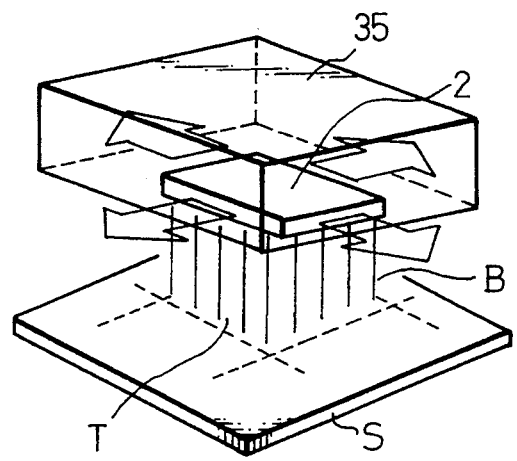
FIG. 13 is an illustration showing an example of a construction for oscillating or scanning the electron beam generator 2 in the pattern inspection apparatus of the invention.
Figure 14:
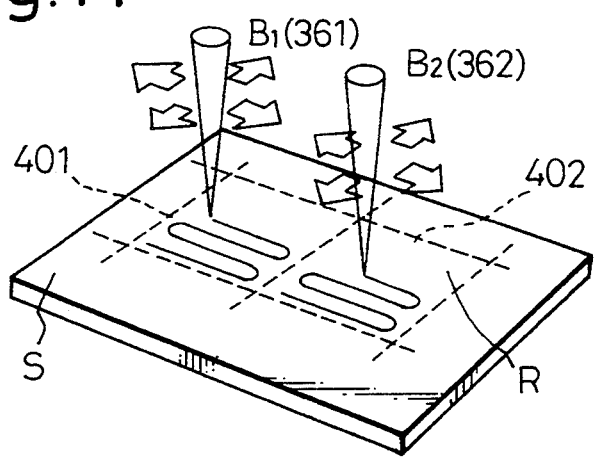
FIG. 14 is an explanatory illustration showing scanning characteristics of electron beams using the apparatus of FIG. 13.

In accordance with the present invention, it is possible to oscillate the electron beam generator 2 per se within a predetermined region or to shift the electron beam generator 2 in two dimensional directions using a driving section 35, instead of employing a deflector 103 in the electronic beam generator described above, and as shown in FIG. 13. With such a construction, as shown in FIG. 14, the electron beams B1, B2 can be irradiated in predetermined regions of the inspection sample uniformly in a relatively wide range. Therefore, the electron beam B is driven so as to shift at high speed within a predetermined appropriate pattern by the driving section 35. This makes a deflecting optical system 103 unnecessary for the electron beam generator 2.

The electron beam generator 2 is mounted on an oscillation stage that is caused to oscillate in a very small range at high speed by the driving section 35. When a piezoelectric oscillation actuator, such as a piezoelectric element or the like, is employed for driving the oscillation stage, high speed oscillation at a frequency of several 10 Khz in a range of several 100 um can be realized.

Figure 15:
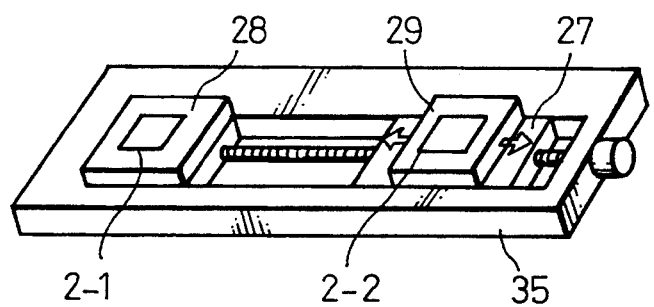
FIG. 15 is an illustration showing an example of a driver for the electron beam generator 2 for performing simultaneous inspection of adjacent samples in the pattern inspection apparatus according to the invention.

In a practical construction of the pattern inspection apparatus according to the present invention, two of the above-mentioned pattern inspection mechanisms are provided for simultaneously inspecting two separate chips. The two pattern inspection mechanisms are at identical positions so that the same locations of the chips can be inspected. The positions of the pattern inspection mechanisms are variable depending upon the size of the chips to be inspected. The positions of the pattern inspection mechanisms are variable depending upon the size of the chips to be inspected. As illustrated in FIG. 15, the electron generators 2-1 and 2-2 are mounted on fine adjustment stages 28 and 29 respectively, which can be moved by a slide 27 for adjusting the distance between stages. It is possible to apply a piezoelectric oscillation element on each sample supporting stage. Furthermore, it may also be possible to cause shifting of the electron beam in the X direction by the above-mentioned mechanical scanning means and to scan the electron beam in the Y direction using an electrostatic deflection electrode 103 (or vice versa).

Figure 16:
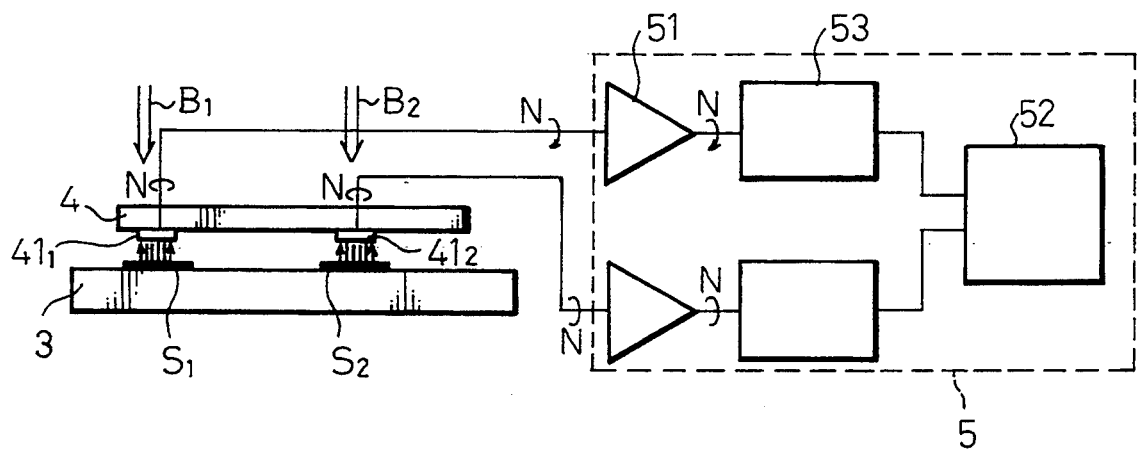
FIG. 16 is an illustration showing an example of an inspection judgement circuit for use when the driver of FIG. 15 is employed.

In the present invention, as shown in FIG. 16, the inspection samples S1 and S2 are mounted on the movable support 3. Samples S1 and S2 are irradiated by electron beams in unison so that respective corresponding electron detecting elements 411 and 417 detect the secondary or backscattered electrons reflected from the irradiated position to output the detection information. The detection information is processed by the amplifier 51 and the image memory 53 and the processed information is then compared in the detecting signal processing circuit 52.

Figure 17:
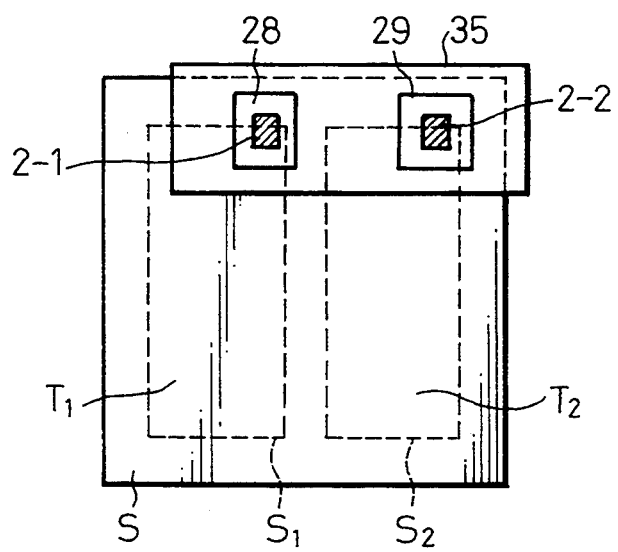
FIG. 17 is a plan view showing an example of a pattern inspection performed employing the driver of FIG. 15.
Figure 18:
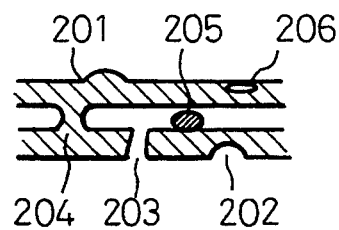
FIG. 18 is an illustration showing examples of defective portions to be detected through pattern inspection.

FIG. 17 is a plan view illustrating a practical method for performing a comparison of the detected patterns of the samples S1 and S2. When the chip pattern TI of the inspection sample S1 and the chip pattern T2 of the inspection sample S2 are compared, the first electron beam generator 2-1 and the second electron beam generating means 2-2, between which fine adjustment of distance is effected, are scanned according to a predetermined scanning pattern by the driving section 35. In addition, if required, by providing fine oscillation, a predetermined deflection is provided for the electron beam B. As an alternative, by employing the deflector incorporated in the electron beam generator, a predetermined deflection is provided for the electron beam B. In this way, the pattern T in the predetermined region can be completely scanned and inspected.

With the practical embodiments set forth above, by irradiating at least one electron beam to a predetermined region on the inspection sample, such as a mask or wafer or the like, and by using secondary electrons or backscattered electrons reflected from the sample or electrons transmitted through the sample, the defects in the circuit pattern on the inspection sample can be detected with satisfactorily high sensitivity and resolution and at high speed. Accordingly, it becomes possible to provide a pattern inspection device that can be adapted to an increase of the fineness of the circuit pattern and to an increase in the package density.

In addition, when an inspection is performed on an inspection sample, such as an X-ray mask or the like, by detecting transmission electrons, detection errors caused by dust can be successfully prevented to enhance the accuracy of the inspection.

Next, another embodiment of a pattern inspection apparatus according to the present invention will be discussed.

With the foregoing embodiment, the objects of the present invention can be attained. However, in the case of the pattern inspection apparatus that employs a plurality of parallel scanning electron beams, the respective electron flow entering the corresponding electron flow detecting sections may be interfered with by electrons from an adjacent irradiation region. This degrades the S/N ratio at the boundary regions between adjacent irradiated regions.

Therefore, by solving the above-mentioned problem, the effect of the present invention can be improved. Thus, the embodiment described above may be adapted for achieving a shortened inspection time as well as for providing an enhanced S/N ratio at the respective electron irradiation regions.

As set forth above, when a single electron beam is irradiated onto the predetermined region of the inspection sample for detecting backscattered electrons or secondary electrons generated by such irradiation by the corresponding detecting section, the secondary electrons generated in an adjacent inspection region can be superimposed on the backscattered or secondary electrons from the region being inspected. In such a case, an error, such as when the presence of a pattern is detected even though a pattern is not present in the inspection region, can result.

For avoiding superimposition of the secondary electrons from the adjacent inspection region, various proposals have been made. In the shown embodiment, a plurality of electron beams are modulated into a pulse so that the pulse period of respective electron beams irradiating respective adjacent inspection regions are differentiated from each other. Upon detection of secondary electrons from a respective inspection region, the pulse period of the electron beam is synchronized so that only the synchronized pulse is processed for inspection. As an alternative, the pulse width of the electron beams may be set at specific known values, and measurement of the secondary electrons of the corresponding inspection region may be controlled so as to take place only in response to the occurrence of the specific pulse width of the electron beam.

In addition, in the shown embodiment, the electron beams consisting of pulses having different periodicities are subject to a time-division based multiplexing process so that the secondary electrons of the region to be inspected is measured in synchronism with the specific pulse.

Also, in the shown embodiment, a plurality of electron beams are respectively modulated and composed so as to form a modulated electron beam. With this modulated electron beam, the secondary electron beam of the region to be inspected is measured in synchronism with the specific pulse width.

In the shown embodiment, the electron beam may also be processed to form a pulse or to be modulated so that a time difference is provided in the measurement timing of the secondary electrons at respective inspection regions to avoid any influence from secondary electrons from adjacent inspection regions.

In the present invention, the modulating process includes a time-sharing process and a detection method as well as an ordinary modulation process.

FIG. 19 shows the use of such principles in connection with an embodiment of the pattern inspection apparatus according to the present invention. The apparatus of FIG. 19 includes an electron beam supply source 301, an electron beam modulating unit 302 an electron beam scanning unit 303, an electron flow detecting unit 304, a signal processing section 305 which processes an incoming modulation signal 1. The apparatus is used to inspect the inspection sample 310. It should be noted that the shown embodiment is directed to an example employing two electron beams. Also, the electron beam scanning unit 303 is shown as a mechanical scanner for shifting the electron beam supply source 301.

In order to accomplish above-mentioned objects, the pattern inspection apparatus according to the present invention comprises an electron beam supply source 301 for supplying electron beams respectively irradiated onto a plurality of irradiating regions of an inspection sample 310, an electron beam modulating unit 302 for modulating the respective electron beams into modulated signals having mutually distinct signal patterns, an electron beam scanning unit 303 for shifting the irradiating position of respective electron beams in order, an electron flow detecting unit 304 for detecting the electron flow from the inspection sample 310 generated by the electron beam and including information relating to the construction of a respective irradiated region, and a signal processing section 305 for extracting a signal representative of the construction of a respective irradiating region from the output signal of the electron flow detecting unit 304.

Respective electron beams supplied through the electron supply source 301 are modulated into the mutually distinct patterns of modulated signals by the electron beam modulating unit 302. The modulated signals of the electron beams are scanned on respective irradiating regions on the inspection sample via the electron beam scanning unit 303. The electron flow generated at respective irradiated regions by irradiation of the electron beams are gathered by incidence to the common electron current detecting unit 304 and subsequently input to the signal processing section 305. The signal processing section 305 thus derives signals indicative of the construction of respective irradiated regions.

Further detailed discussion about the foregoing embodiment will be given hereafter with reference to the drawings. FIG. 20 shows, in the form of a diagram, the construction of the shown embodiment of the pattern inspection apparatus. In FIG. 20, an electron generating element 411 forming a part of the electron beam supply source includes a plurality of electron emitters 411 and 412 on a common plane. The electron emitters 411 and 412 emit electron beams 361 and 362. The electron beams 361 and 362 are modulated by modulating electrodes 321 and 322 that form the electron beam modulating unit and which receive a modulating signal from the signal processing section 305.

The electron beams 361 and 362 pass a common converging electrode 312 that converges respective electron beams in a respective fine area, and deflection electrodes 331 and 332 are provided for respective electron beams 361 and 362 to reach the inspecting sample 310. The converging electrode 312 forms a part of the electron beam supply source. The deflection electrodes 331 and 332 scan respective irradiation regions 401 and 402 of the inspection sample by shifting the electron beams 361 and 362 in order within the irradiating regions 401 and 402.

The inspection sample 310 is fixed on the sample stage 309. The sample stage 309 is adapted to be shifted in X, Y and Z directions via respective XYZ stage shifters. The XYZ stage shifters are designed to be driven by respective drive motors through ball screws or the like. When scanning the electron beam on respective irradiation regions 401 and 402, the deflection electrodes 331 and 332 are used, and the XY stage shifter motors are driven for scanning another irradiation region of the inspection sample 310.

On the upper portion of the inspection sample 310, the common electron flow detecting section 304 is provided to commonly detect the backscattered electrons 371 and 372 generated by irradiation of the electron beams 361 and 362 on respective irradiation regions 401 and 402. The output of the electron current detecting section 304 is input to the signal processing section 305.

The signal processing section 305 comprises a CPU 351 for controlling the overall pattern inspection apparatus, modulated signal generating sections 352 and 353 for providing the modulating signals for respective modulating electrodes 321 and 322 via amplifiers 357 and 358, a signal discrimination section 354 for discriminating the configuration signals from the irradiation regions 401 and 402 taking respective modulated signals from the modulating signal generating sections 352 and 353 as reference signals, an image processing section 355 for receiving the output of the signal discriminating section 354 to convert the information contained therein into a binary image signal, and a memory section 356 for storing the binary image signal.

Figure 21A:
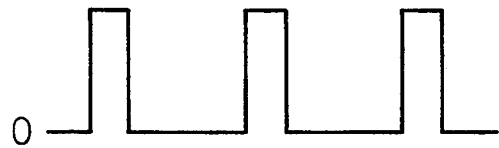
FIGS. 21(a) to 21(e) are diagrams which show waveforms in various portions of the pattern inspection apparatus of FIG. 20.
Figure 21B:
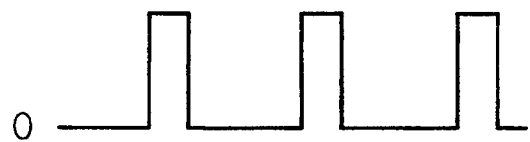

FIGS. 21(a) through 21(e) FIGS. 21(a) through 21(e) show waveforms of the signals to be used for discussion about respective signals in a pattern inspection apparatus. In this embodiment, the modulating unit forms pulses of the sequence of the electron beam for alternatively using two pulses having mutually different pulse phases. In the present invention, the modulation method includes a method for making a pulse signal from a continuous beam. The modulated pulse signals illustrated in FIGS. 21(a) and 21(b) are pulse signals having mutually similar pulse frequencies and peaks thereof appear in alternative fashion. Namely, the shown embodiment is directed to the example of signal processing in time-division multiplexing.

Figure 21C:

The signals of the electron flow gathered in the electron detecting section 304 by incidence thereon from respective irradiation regions is illustrated in FIG. 21(c) as the input for the signal discriminating section. Namely, when the modulated pulse signal 1 is at the level H, the input signal for the signal discriminating section discriminates the signal as the configuration signal of the irradiation region 401. On the other hand, when the modulated pulse signal 2 is at the level H, the signal discriminating section discriminates the input as the configuration signal of the irradiation region 402.

Figure 21D:
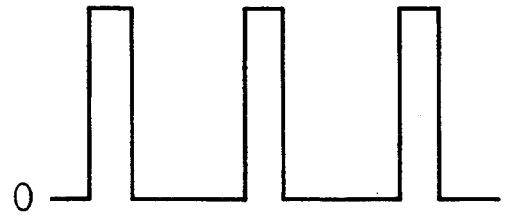
Figure 21E:
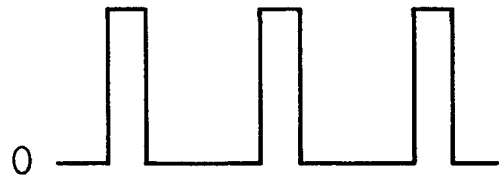

In the signal discriminating section 354, by employing the pulse signal 1 as the reference signal, an output as illustrated in FIG. 21(d) may be obtained as the configuration signal of the irradiation region 401. On the other hand, by employing the pulse signal 2 as the reference signal for discrimination, the output 2 illustrated in FIG. 21(e) is obtained as the configuration signal of the irradiation region 402. The amplitude of these outputs represents the pattern at respective irradiation regions 401 and 402. These signals are thus discriminated by the signal discriminating section 354 and converted into digital signals by the image processing section 355 in parallel with one another.

The output of the image processing section 355 is stored in the memory section 356 as digital image information. By a signal processing section, which is not shown and follows the memory section 356, conventional signal processing is performed for implementing a pattern inspection.

An example is given to the signal frequency to be used. When the period during which each electron beam is processed and modulated into a pulse signal, and namely, the period during which an electron remains on the pulse generating electrode, is 500 nsec, approximately 2 Mhz is used as the frequency of the pulse signal. In such a case, assuming the total number of irradiation regions to be irradiated in parallel formation according to the present invention is 100, and by employing time-sharing multiplexing, the pulse width of a respective modulated pulse signal becomes 500 nsec./100=5 nsec. Accordingly, in such time sharing multiplexing of pattern information of the inspection samples, it becomes possible to perform an inspection for 2M×100 each second. Namely, 200 pixel/seconds is possible.

On the other hand, instead of using time-sharing multiplexing, it is possible to use pulse signals having the same frequency and mutually different pulse widths, and even in this case, the signal discrimination taking the moduled signals as reference signals is similar to the former embodiment.

Figure 22:
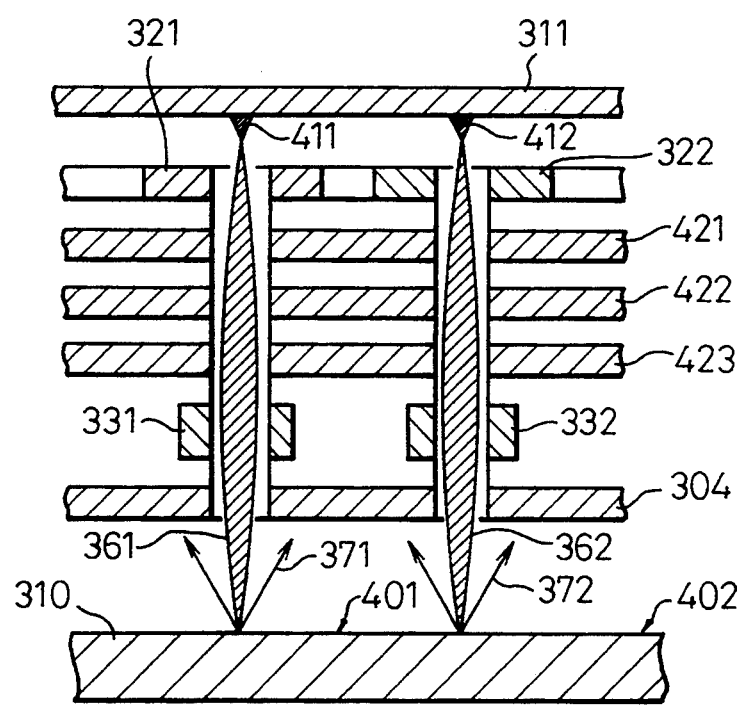
FIG. 22 is a cross-sectional view showing the construction of an electron beam irradiating generator portion of the embodiment of FIG. 20.

FIG. 22 shows a cross-section of the construction details of the electron beam irradiating portion in the embodiment of FIG. 20. As shown in FIG. 22, electron beams are supplied by an electron beam generating section 311, the converging electrodes 421 to 423 form a three stage lens, and modulating electrodes 321 and 322 are disposed therebetween. Deflection electrodes 331 and 332 are provided between the converging electrodes and the sample 310.

In the construction of the electron beam irradiating portion, the electron beam generating section 311, the modulating electrodes 321 and 322, the converging electrodes 21 to 423 and the deflection electrodes 331 and 332 are preferably formed on a silicon substrate employing fine processing technology. Such construction has been reported in G. W. Jones et al. "Microstructure for Particle beam Control", J. Vac. Sci. Technol. pages 2023 to 2027, B6(6), Nov./Dec. 1988, for example.

As shown in FIG. 22, the converging electrode is formed of three electrostatic lens stages 421, 422 and 423 arranged along the traveling direction of the electron beams 361 and 362. The front stage electrostatic lens 421 is set at a high potential with respect to the electron beam generating section 311 and such lens is commonly used as an output line for extracting electrons from the electron emitters 411 and 412.

The rear stage electrostatic lens 423 is maintained at an equal potential to the front stage electrode 421. The intermediate electrode 422 is maintained at a different potential than the electrodes 421 and 423. The three stage electrostatic converging lens converges the electron becomes emitted from the electron emitters 411 and 412 otherwise have a tendency to be scattered.

The modulating electrodes 321 and 322 modulate electron beams 361 and 362 into pulses according to the modulating signals. In such a case, the peaks of the modulating signal become equal in potential to the electron beam generating section 311 so as to permit generation of the electron beam, and the valleys of the pulse of the modulating signal reach a negative value so as to shut the front stage electrostatic lens 421 and block the emission of electrons to thus control the amount of electrons generated from the electron beam generating section 311.

The deflection electrodes 331 and 332 are provided the same scanning signals so that scanning voltages are applied between the deflection electrodes respectively in opposing X and Y directions. By deflecting the electron beams simultaneously in the same direction according to the scanning voltage, scanning of respective irradiating regions occurs simultaneously.

The manner of scanning is illustrated in FIG. 14. The electron beams 361 and 362 converging at the irradiation regions 401 and 402 by the effect of the converging electrodes are shifted in four directions parallel to the irradiation surfaces of respective irradiation regions 401 and 402 of the inspection sample by respectively corresponding deflection electrodes, as illustrated by arrows, so that all areas in the irradiation regions 401 and 402 can be scanned.

Figure 23:
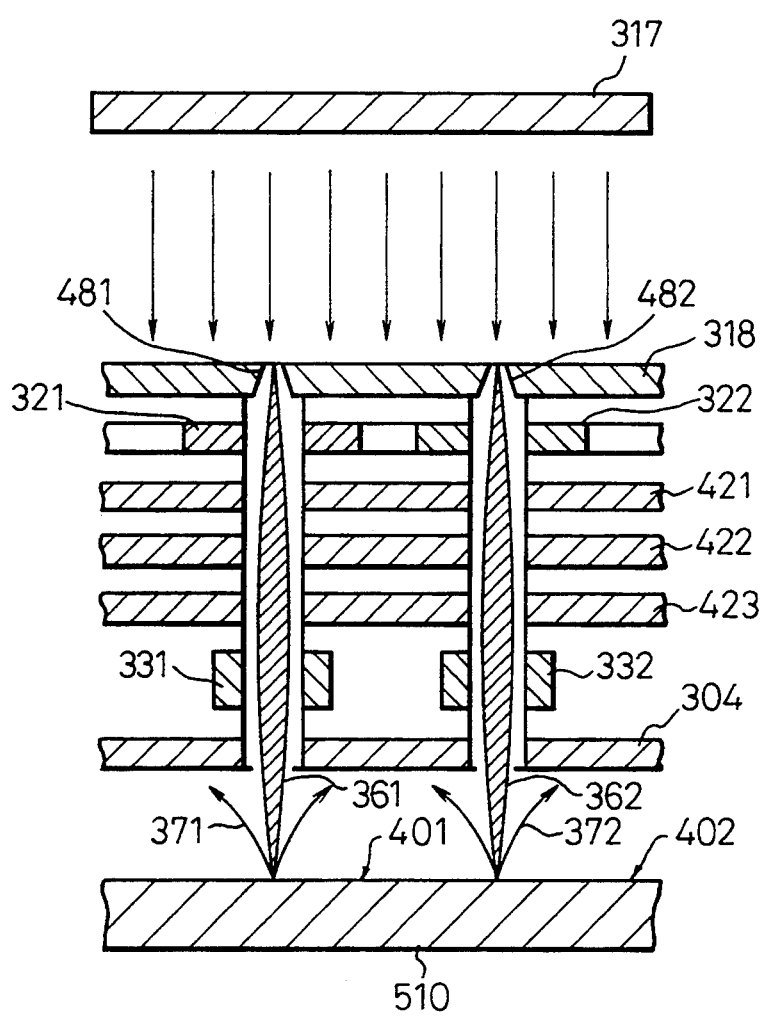
FIG. 23 is a view which is similar to FIG. 22 but showing a second embodiment of the pattern inspection apparatus according to the invention.

FIG. 23 is a cross-sectional view showing another construction of the electron beam irradiating portion in the pattern inspection apparatus according to the present invention that corresponds to that illustrated in FIG. 10. In FIG. 23, the electron beam generating section is differentiated from that shown in FIG. 22 and comprises an electron supply source 317 for supplying electrons uniformly, and a shielding plate 318 having fine apertures 481 and 482 at positions corresponding to respective irradiation regions for allowing electron beams to pass therethrough. An accelerating voltage is applied at a position between the shielding plate 318 and the front stage electrostatic lens 421 for accelerating the electrons. Otherwise, the construction is the same as that of FIG. 22.

Figure 24:
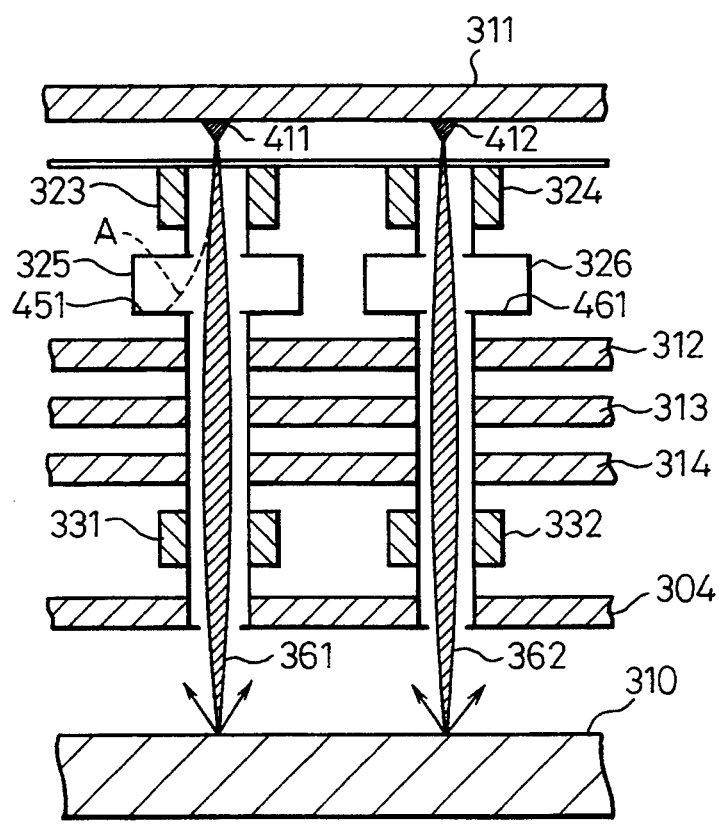
FIG. 24 is another view which is similar to FIG. 22 but showing a third embodiment of the pattern inspection apparatus according to the invention.

FIG. 24 is a cross-sectional view showing the electron beam irradiating portion of a third embodiment of the pattern inspection apparatus according to the present invention, In this embodiment, in place of the modulating electrodes 321 and 322 for modulating the electron beam as illustrated in FIG. 22, the apparatus includes deflection modulating electrodes 323 and 324 for deflecting the electron beams 361 and 362 in a direction perpendicular to the traveling direction as illustrated by broken line A, and passing control sections 325 and 326 having walls 451 and 461 for blocking the deflected electron beam by. Otherwise the construction is the same as that of FIG. 22. The signal waveform in this embodiment is similar to that shown in FIG. 21 and therefore discussion thereof is omitted.

In the embodiment of FIG. 24, by sequentially deflecting the axis of the electron beam transversely, a pulse form electron beam is irradiated onto the irradiation region.

FIG. 43 shows signal wave forms used in another embodiment of the modulating method of the present invention in which each of the main pulse wave signals is modulated by adding thereto a plurality of additional pulsed signals, each having a different frequency and the main pulse wave signal per se can be discriminated from the detected signal, the plurality of additional pulsed wave signals being integrated into the main pulse wave signal by tuning the main pulse wave signal at the same frequency as the main pulse wave signal originally had.

For example, FIG. 43(a)-1 shows the wave form of the main pulse wave signal in a beam used in the present invention while FIG. 43(a)-2 shows the wave form of the noise caused by an interference signal generated by adjacent pulse wave signal beams.

Figures 3, 43A:

The main pulse wave signal has a frequency different from that of the interference signal and FIG. 43(a)-3 shows the wave form of a modulated pulsed wave signal in which the main pulse wave signal 1 is modulated by the noise pulse wave signal 2 and thus a detector detects the pulse wave form 3 which has the noise incorporated therein.

Note, that in FIG. 43(a)-3, a dotted line represents the true pulse wave form of the main pulse wave signal 1.

Figure 43B:
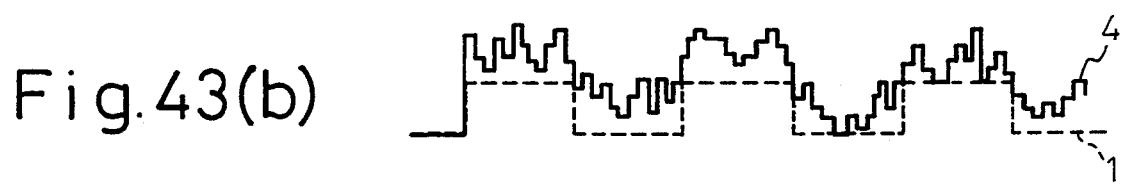

FIG. 43(b) shows the pulse wave form of a modulated pulsed wave signal in which the main pulse wave signal 1 is interfered with by a plurality of pulsed noise wave signals, each having a different frequency.

In this embodiment, the pulse wave signal shown in FIG. 43(b) is formed by modulating the main pulse wave signal 1 with a plurality of pulsed noise wave signals.

Figure 43C:

FIG. 43(c) shows a modulated wave form obtained from the pulse wave form of FIG. 43(b) by passing it through a band-pass filter having the same frequency as the original frequency of the main pulse wave signal as a center of the band. Continuous line 5 represents the wave form of the modulated wave form of the pulse wave signal 1 in which both the high frequency components and the low frequency components are deleted from the final wave form.

The wave form as shown in FIG. 43(c), for example, represents a signal level which indicates that the pulse wave signal 1 is used to detect white patterns, i.e., the fact that patterns exist.

Figure 43D:

On the other hand, FIG. 43(d) shows a modulated wave form obtained from another pulse wave form generated in a condition in which no pattern exists in the same way as explained above, and the continuous line 6 represents a signal level showing that the pulse wave signal is used to detect black patterns, i.e., the fact that no pattern exists.

Accordingly, whether or not a pattern exists on the substrate, can be discriminazed by detecting the difference of amplitudes of the two separate wave forms.

With the shown construction, a plurality of irradiation regions can be scanned by electron beams simultaneously enabling high speed inspection. Also, interference between adjacent electron beams can be successfully prevented so as to obtain configuration signals with an enhanced S/N ratio. Therefore, the shown embodiment of the pattern inspection apparatus can perform accurate inspections in a short inspection period.

Although the foregoing embodiment attains a remarkable improvement of the efficiency of inspection and avoids mutual interference of adjacent electron beams, the following unsolved problem remains.

Namely, the foregoing pattern inspection apparatus according to the present invention, is composed of a plurality of electron guns, beam extracting electrodes, converging electrodes and deflection electrodes. When respective electron guns or respective electrodes include production tolerances, slight variations are induced in the characteristics of the electron beams so as to cause fluctuations of the focus points of the electron beams. In some cases, the focus point is set in front of or behind the irradiation surface to cause focus error at the image to be inspected. This problem is encountered not only during pattern inspection but also in the drawing of patterns employing an electron beam exposure device. To solve this problem, the electron beams emitted from a plurality of electron guns must be uniformly irradiated onto the inspection surface. The following embodiment of the pattern inspection apparatus proposes a solution for this problem by comparing each electrode with a preliminarily provided reference electrode so as to individually adjust the characteristics thereof and make it consistent with that of the reference electrode.

The following is a discussion for this embodiment of the pattern inspection apparatus according to the present invention.

Figure 25:
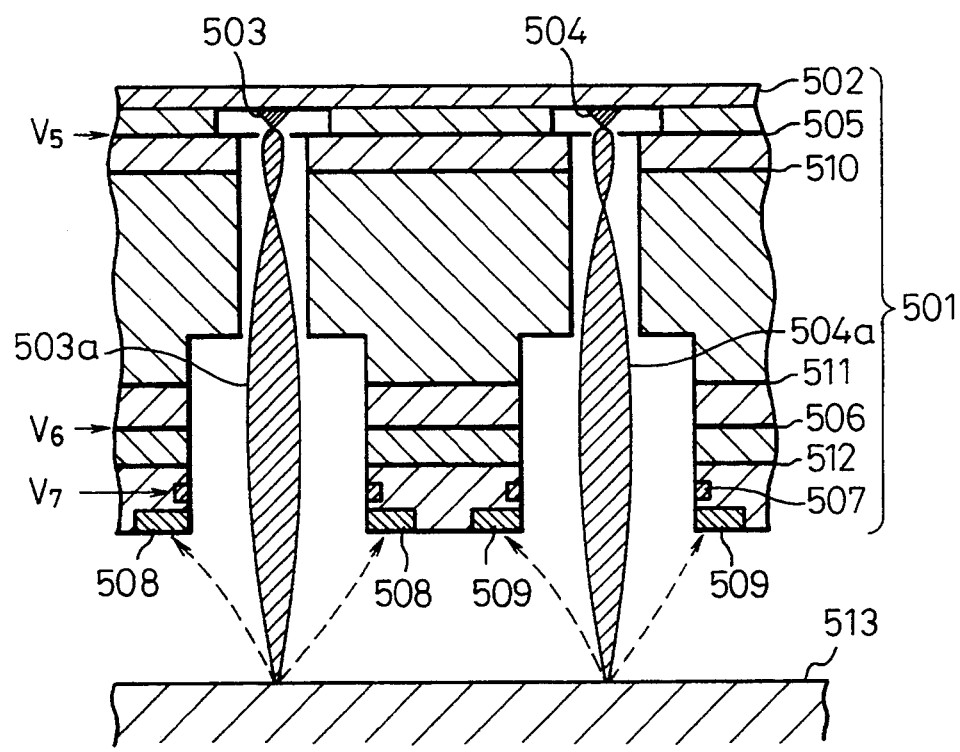
FIG. 25 shows the major components of a conventional pattern inspection apparatus.

FIG. 25 shows the construction of a major portion of an embodiment of the pattern inspection apparatus according to the invention. As shown in FIG. 25, the apparatus includes an electron beam generator 501. The electron beam generator 501 includes a silicon substrate 502, on which a plurality of (two are shown in the drawing) electron emitters 503 and 504 are formed of silicon, a metal such as Ta or the like, or a compound such as lanthanum boride or the like. Below the electron emitters 503 and 504, a plurality of laminated layers are formed so as to prevent an extraction electrode 505, a converging electrode 506, a deflection electrode 507 and detectors 508 and 509 as shown. In FIG. 25, the reference numeral 510 denotes an anode, the reference numerals 511 and 512 denote grounding electrodes, and the reference numeral 513 denotes an inspection sample, such as an exposure mask or the like, on which a fine pattern (omitted from illustration) is formed.

The charged particle beams (electron beams) 503a and 504a emitted from emitters 503 and 504 have a beam current corresponding to the electrode voltage $V_5$ of the extraction electrode 505. The electron beams 503a and 504a are then converged with a convergence ratio corresponding to the electrode voltage $V_6$ of the converging electrode 506. Subsequently, the electron beams 503a and 504a are deflected at a deflection angle corresponding to the electrode voltage $V_7$ of the deflection electrode 507 and are thus irradiated onto the sample 513 in the form of a spot.

Then, backscattered or secondary electrons (illustrated by broken lines) are discharged from the surface of the sample 513, for example an X-ray mask in response to irradiation of the sample by the electron beams 503a and 504a. These emitted electrons are caught by the detectors 508 and 509 and converted into electric signals, and a greater amount of emitted electrons are emitted from the electron beam absorber than from the mask substrate forming the sample 513, because the material (gold, tantalum and other elements having a large atomic weight) used for the electron beam absorber has a higher generation ratio of backscattered electrons or secondary electrons than the material (silicon or other elements having a small atomic weight) used for the mask substrate.

Accordingly, by simultaneously irradiating a plurality of electron beams 503a and 504a and unitarily processing the outputs of the detectors 508 and 509 for the respective electron beams, a large amount of pattern data relating closely to the pattern formed on the surface of the sample 513 can be inspected rapidly and accurately. Also, when the apparatus is applied to pattern drawing, a circuit pattern having a large amount of pattern data can be rapidly and accurately drawn.

However, in the above-mentioned electron beam apparatus, since common electrodes are provided for a plurality of electron beams, it can happen that the spot diameters of the electron beams are slightly differentiated, that the beam axes are slightly offset, or that the deflection angles do not become precisely coincident with each other, due to the mechanical tolerances of the electromagnetic optical systems for the respective electron beams. Therefore, in view of the need for making the electron beam characteristics coincident with each other with high precision, there still remains a technical problem to be solved.

Figure 26:
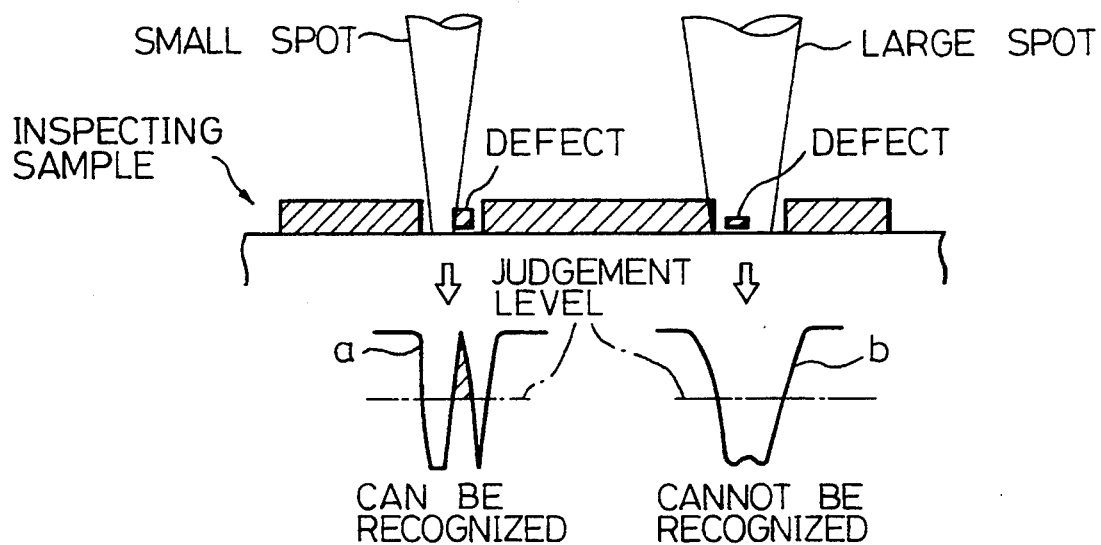
FIG. 26 is an illustration showing an example of a drawback due to the fluctuation of spot diameter in the prior art.

FIG. 26 illustrates a problem arising due to fluctuations in the spot diameters of electron beams. Some defects in a circuit pattern can be detected with a smaller spot, however, it is often difficult to detect the same defect with a larger spot. The illustrated waveforms a and b represent the detected intensity of backscattered or secondary electrons reflected from the sample surface or transmission electrons passing through the sample. Although this option is not illustrated in FIG. 26, by providing a detector at the back side of the sample, transmission electrons can be captured and converted into an electron signal to obtain one dimensional information relating to the transmission path in addition to two dimensional information relating to the sample. In the case of a large spot, signal intensity at defects is so small that it is difficult to recognize the defects.

Figure 27:
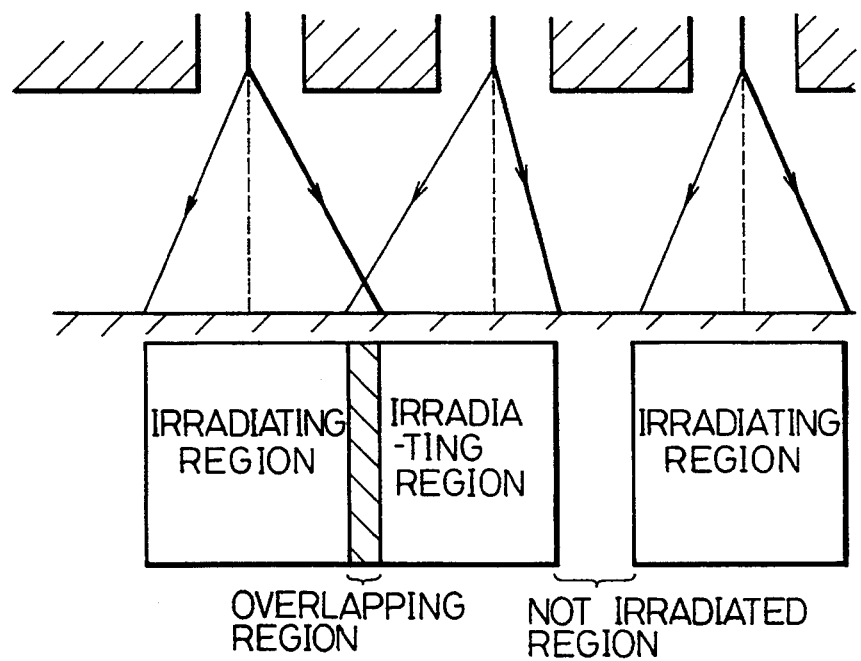
FIG. 27 is an illustration showing an example of a drawback due to the fluctuation of deflection angle in the prior art.

FIG. 27 is an explanatory illustration showing a problem arising due to fluctuations of the deflection angle. When the deflection angle becomes excessive, the electron beam can enter an adjacent irradiation region so as to create an overlapping region presenting a multiple detection region. On the other hand, when the deflection angle is too small, a non-irradiated uninspected region can be left between adjacent irradiation regions.

Such a problem may also occur when the electron beam system is used for pattern drawing. In such a case fluctuations in spot diameter may degrade the precision of patterning. On the other hand, fluctuations in deflection angle may cause degradation of the precision of pattern drawing positions.

Therefore, the present invention proposes an electron beam system that enables the separate adjustment of the various characteristics of each individual electron beam and thus enables the provision of several electron beams having uniform precise characteristics.

Figure 28:
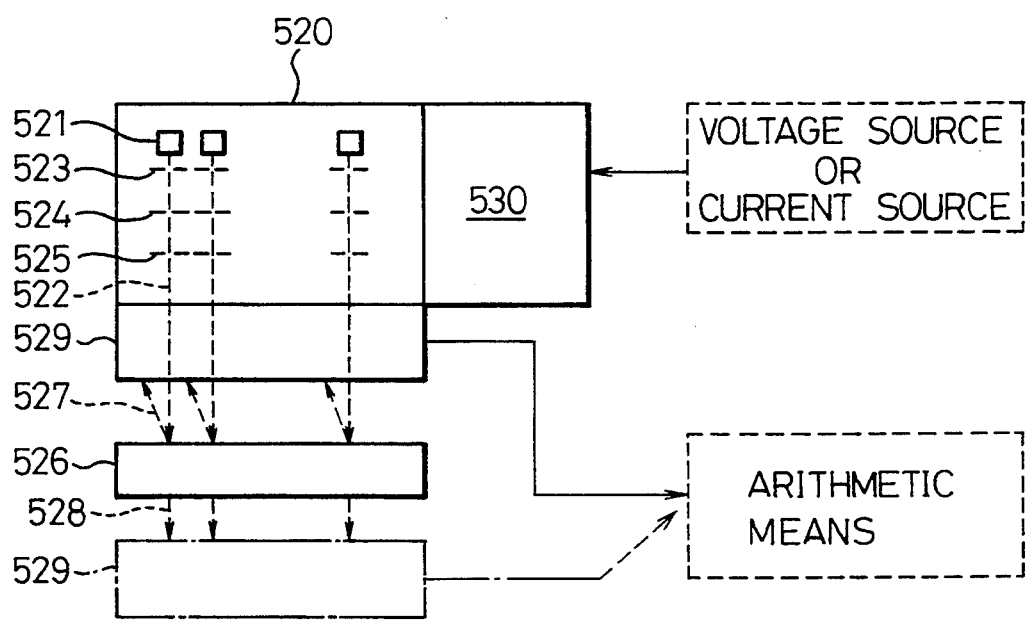
FIG. 28 is a diagram showing the principles of another embodiment of the pattern inspection apparatus according to the invention.

FIG. 28 shows an embodiment of an electron beam system for implementing the invention set forth above. As shown in FIG. 28, a plurality of electron emitters 521 are formed on a common substrate 520 or separated substrates arranged on a common plane. For each of the individual electron emitters 521, the system of FIG. 28 includes an extraction electrode 523 for extracting a charged particle beam 522 from the electron emitter 521, a converging electrode or coil 524 for converging the beam 522 according to a converging ratio corresponding to the electrode voltage or energization current, a deflection electrode or coil 525 for deflecting the beam 522 through a deflection angle corresponding to the electrode voltage or energization current, a detector 529 for detecting secondary or backscattered electrons 527 reflected from the surface of the sample 526 or transmission electrons 528 passing through the sample 526, and an adjusting means for all or part of the electrode voltages or energization currents provided for the extraction electrode 523, the converging electrode or coil 524 and the deflection electrode or coil 525.

In the shown embodiment, the electrode voltages or energization currents for each of the charged electron beams can be adjusted independently. For example, by adjusting the electrode voltage of the converging electrode 524, the spot diameter of the charged particle beam can be adjusted. On the other hand, by adjusting the electrode voltage of the extraction electrode 523, the beam current is varied to adjust the spot diameter. As an alternative, by adjusting the electrode voltage of the deflection electrode 525, the charged particle beam axis can be adjusted.

Therefore, the overall electron beam characteristics can be made uniform with high accuracy.

A practical embodiment of the electron beam system according to the invention will be discussed hereinbelow.

FIGS. 29 to 35 show a practical embodiment of an electron beam system that is applied as a pattern inspection apparatus.

Figure 29:
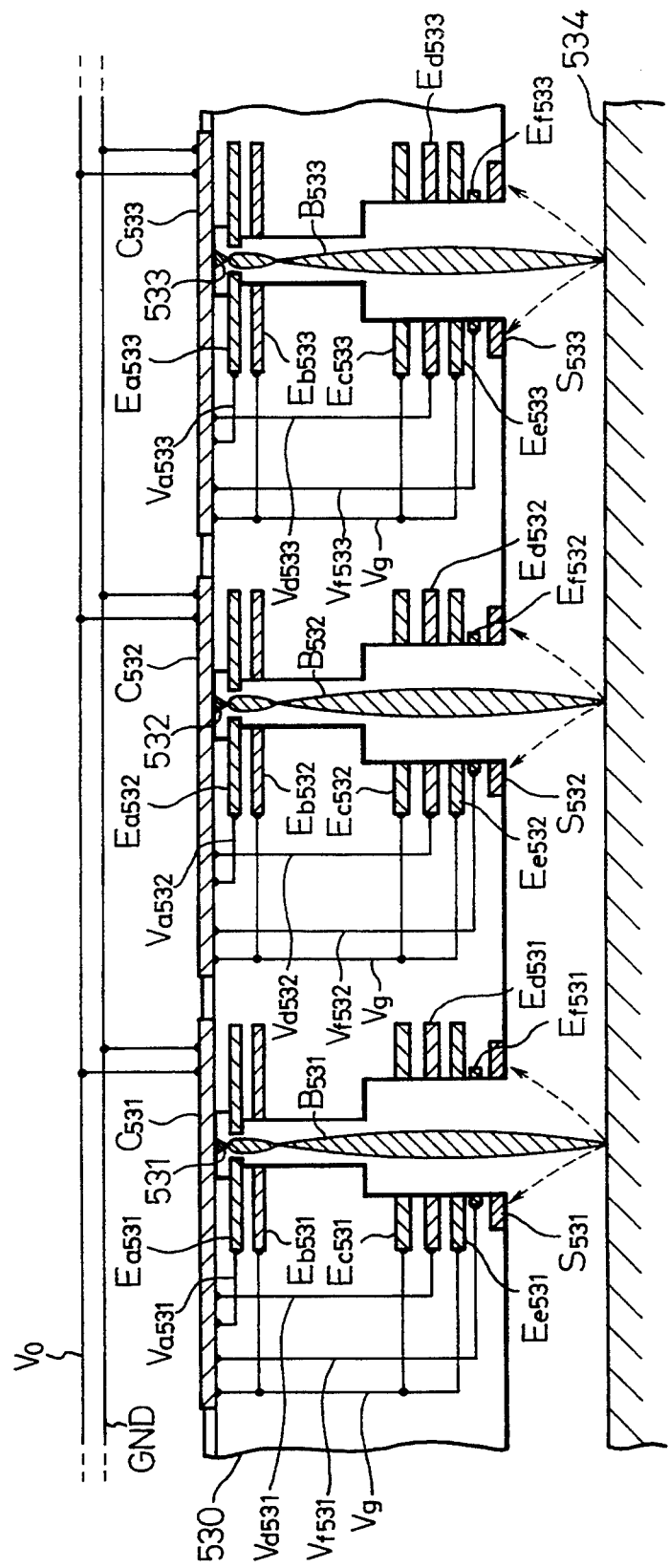
FIG. 29 is a diagram showing the major components of another embodiment of the pattern inspection apparatus of FIG. 28.

In FIG. 29, the reference numeral 530 denotes one or more substrates of a multi-layer structure. The system of FIG. 29 includes a plurality (three are shown in the drawing) of electron emitters 531 to 533 formed of a material, such as or silicon, a metal such as Ta or the like, or a compound such as lanthanum boride or the like. It should be noted here that the substrate 530 can be a single common substrate for the electron emitters 531 to 533, or as an alternative, can be in the form of an individual independent substrate for each of the electron emitters 531 to 533. As a further alternative, the substrate 530 can be formed by laminating a plurality of substrates together. In the case of the individual independent substrates, however, the individual substrates must be arranged on a common plane and integrated by being fixed to each other.

Below each of the electron emitters 531 to 533, an extracting electrode $Ea_i$ (where i is 531, 532 and 533, and is the same in the following), an anode $Eb_i$, a first grounding electrode $Ec_i$, a converging electrode $Ed_i$, a second grounding electrode $Ee_i$, a deflection electrode $Ef_i$ and a detector $S_i$ are provided in the stated order. These elements are provided exclusively for corresponding to a respective one of the electron emitters 531 to 533.

Here, discussion will be provided for the major electrodes. Each extraction electrode $Ea_i$ is adapted to extract a charged particle beam (electron beam) $B_i$ having a beam current corresponding to a given electrode voltage $Va_i$. from the electron emitter 531 (or 532 or 533). The converging electrode $Ed_i$ converges the electron beam by generating an electric field having an intensity corresponding to the charged electrode voltage $Vd_i$. The deflection electrode generates an electric field corresponding to the charged electrode voltage $Vf_i$ for providing a deflection angle for the electron beam. Other electrodes (anode electrode $Eb_i$, first grounding electrode $Ec_i$ and second grounding electrode $Ee_i$) are adapted to assist in the function of the extraction electrode Ea$_i$, or to form an electric field distribution for converging electrons between the converging electrode. For these electrodes, the same electrode potential voltage Vg (grounding potential) is provided.

The above-mentioned construction merely shows a typical construction in number of electrodes, layout of electrodes and distribution of charged voltages, and should not be regarded as essential for implementing the invention. Furthermore, although the foregoing example discusses electrostatic convergence and deflection, the drive functions need not be energized electrostatically but can alternatively be energized electromagnetically. Also, it is possible to use both electrostatic and electromagnetic energization in combination. However, in the case that electromagnetic energization is employed, the converging and deflection electrodes should be replaced by converging and deflection coils. Also, the power applied to these elements will be an engergization current.

The detector S$_i$, provided for each respective electron beam B$_i$ is adapted to catch backscattered or secondary electrons emitted from the surface of the sample 534, which is an X-ray exposure mask or the like, to mark for aligning the sample 534 to be exposed or a correction unit pattern, which will be discussed later, and to convert such electrons into an electric signal. The electric signal output from respective detectors S$_i$ contains information representative of the configuration of a small portion of the electron beam absorber (not shown) on the sample 534, i.e., representative of the circuit pattern in a small portion of the sample. Accordingly, the two dimensional information relating to the sample 534 can be reproduced from all of the electric signals. Therefore, defective areas (white defects or black defects, for example) in the fine pattern can be accurately identified. Alternatively, although it is not illustrated, by locating the detector behind the sample, transmission electrons can be captured and converted into an electron signal to provide one dimensional information of the transmission path in addition to the two dimensional information of the sample.

The circuits C$_i$ for a the respective beams formed by fine processing technology on the upper surface of the substrate function as the adjusting means, as set forth above, and are adapted to generate the necessary voltages Va$_i$, Vd$_i$, Vf$_i$ and Vg using voltage divider resistors, for example.

FIG. 30 shows a plan view of the circuits C$_i$ and the details thereof. The power source voltage V$_0$, applied to the circuits C$_i$ is taken out as Va$_i$, Vd$_i$ or Vf$_i$ through a parallel resistor network including several resistors (R$_1$, R$_2$, R$_3$ and R$_4$). By selectively cutting off the resistor elements, the voltage can be adjusted. Voltage adjustment can also be effective using a series resistor network or a combination of series and parallel resistors. Also, instead of cutting off a the selected resistor, an equivalent voltage adjustment can be done by adding one or more selected resistor. Furthermore, respective elements in the resistor network can be formed by transistors. As a suitable device for cutting off and connecting the fine pattern, a mask repair device disclosed in "Precision Mechanics Paper" (Vol. 53, No. 6, pages 15 to 18) Jun. 5, 1987, Precision Mechanics Association), for example, in which high luminous FIB (Focused Ion Beam), higher than or equal to 1 A/cm$^2$ having a beam diameter less than or equal to 0.1 μm, is generated for correction (cutting out of black defect or connection by deposition of the material vapor) of the pattern defect (black or white defect) on the photo mask by the FIB.

Figure 31:
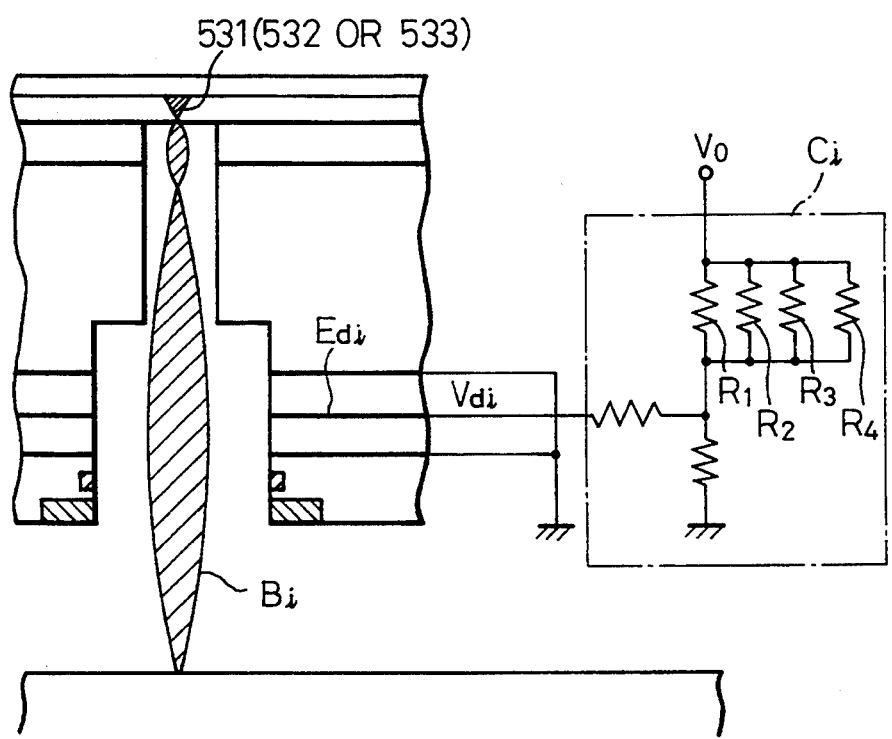
FIG. 31 is an illustration of a connection when an electrode voltage Vdzi of a converging electrode Edzi is adjusted.

Referring to FIG. 31, by selectively cutting off respective resistor elements R$_1$ to R$_4$ of the circuit C$_i$, the electrode voltage Vd$_i$ for converging the electron beam B$_i$ can be appropriately adjusted by applying it to the converging electrode Ed$_i$ and varying the voltage division ratio of the power source voltage V$_0$. In this way, the converging ratio of the electron beam B$_i$ converged by the converging electrode Ed$_i$ can be adjusted so as to adjust the spot diameter.

On the other hand, although it is not illustrated in the drawing, by adjusting the electrode voltage Va$_i$ applied to the extraction electrode Ea$_i$, the magnitude of the beam current of the electron beam B$_i$ can be adjusted independently since there is a correlation between beam current and spot diameter.

Furthermore, though it is not illustrated, by adjusting the electrode voltage Vf$_i$ supplied to the deflection electrode Ef$_i$ the beam axis and the deflection angle of the electron beam B$_i$ can be adjusted.

FIG. 31 is an illustration of a connection for adjusting the electrode voltage Vdzi of a converging electrode Edzi.

As set forth above, since the characteristics of each of the electron beams can be adjusted independently, the characteristics of the overall electron beam can be made uniform. Therefore the shown embodiment is successful in solving the problem concerning the inconsistency of beam axes or deflection angles.

Figure 32A:
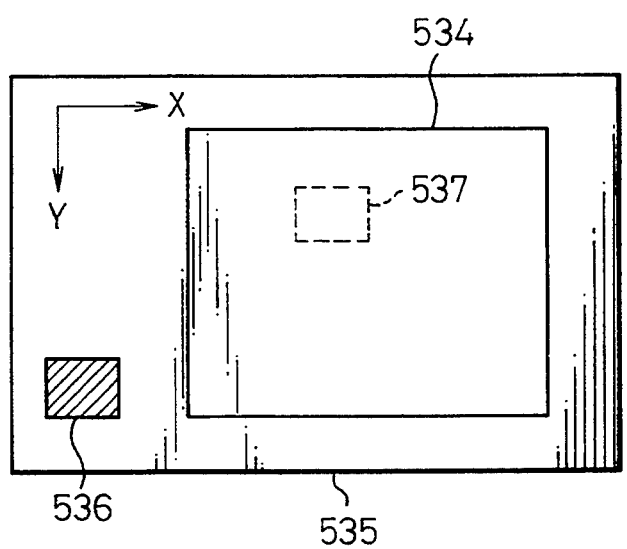
FIGS. 32(a) and 32(b) are illustrations showing a layout of the basic pattern in an embodiment of the invention.
Figure 32B:
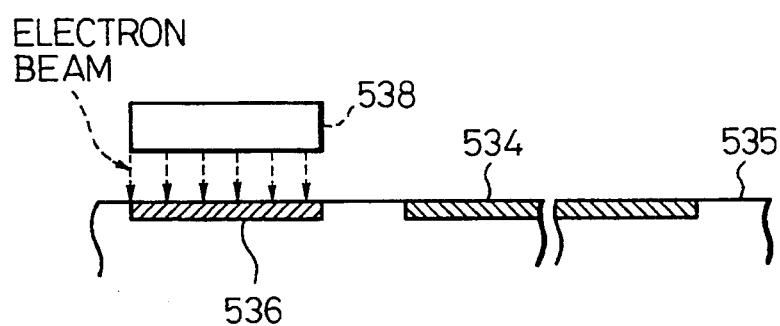

Next, a preferred example for detecting fluctuations in the characteristics of the electron beam B$_i$ will be discussed. FIG. 32(a) is a plan view of a table 535 that is movable in X-Y directions when the sample 534 is mounted thereon. A reference pattern section 536 is fixedly provided at a predetermined position on table 535 so that it can be placed within the irradiation region of a plurality of electron beams by shifting the table 535. FIG. 32(b) is a side elevational view wherein the reference pattern portion 536 is shown as being positioned within the irradiation region 537 of the electron beams. A plurality of electron beams discharged from an electron beam generator 538 which includes a plurality of electron emitters, are irradiated onto the reference pattern portion 536.

In the reference pattern portion 536, a number of precisely designed unit patterns formed from elements having a large atomic weight and corresponding in number to the number of electron beams are arranged in a regular arrangement. The backscattered or secondary electrons discharged from respective unit patterns and circumferential non-patterned portions, or the transmitted electrons passing through the respective unit patterns and the circumferential non-patterned portions are detected by the detector Si.

Figure 33A:
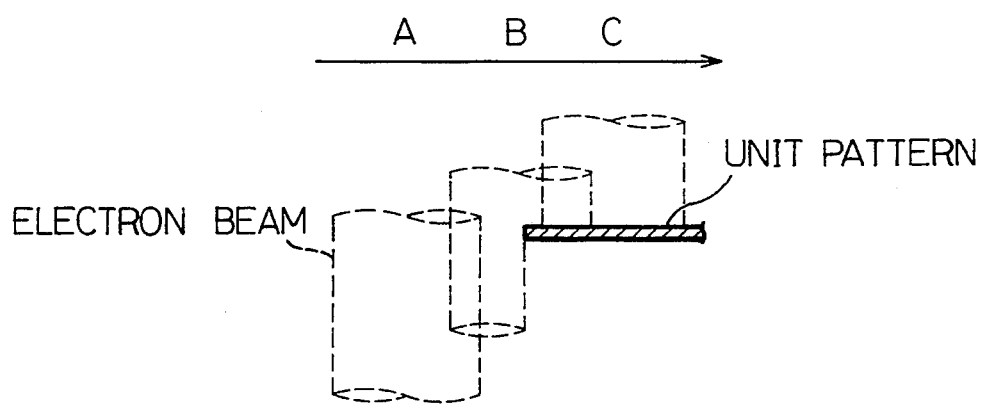
FIGS. 33(a) 33(c) are conceptual illustrations showing a way to measure a spot diameter in a knife edge method according to an embodiment of the invention.
Figure 33B:
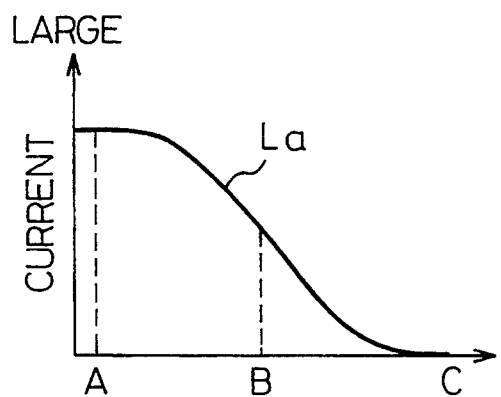
Figure 33C:
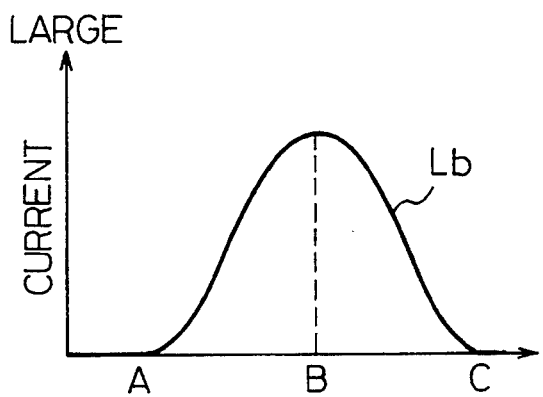

FIG. 33 shows a situation when the electron beam is irradiated on a single unit pattern and a circumferential non-patterned area. It is assumed that the relative positional relationship between the electron beam and the unit pattern is shifted from the position A to a position B and then from the position B to a position C by deflecting the beam or by incremental shifting of the table 535. At position A, the entire electron beam is irradiated on the non-patterned circumferential area. Therefore, the bulk of the transmitted electrons pass through the non-patterned area. At the position B, the electron beam irradiates approximately half of the unit pattern. At this time, the amount of transmitted electrons is less than that at position A. On the other hand, at the position C, the electron beam fully irradiates the unit pattern. Therefore, no electrons are transmitted. FIG. 33(b) is a graph illustrating the variation of the beam current representative of the variation in the transmission of electrons while shifting from the position A to the position C. As can be seen, the line La shows the variation of the beam current, in that the beam current is initially large and abruptly decreases across the position B and then becomes 0. FIG. 33(c) is a graph Lb presenting the differentiated value of the line La. As can be seen, the differentiated value is 0 at both ends and becomes maximum at the position B. The width of the differentiated value curve, Lb (generally half value width), represents the width of the electron beam and the spot diameter. Such a measurement is called a knife edge method.

Figure 34A:
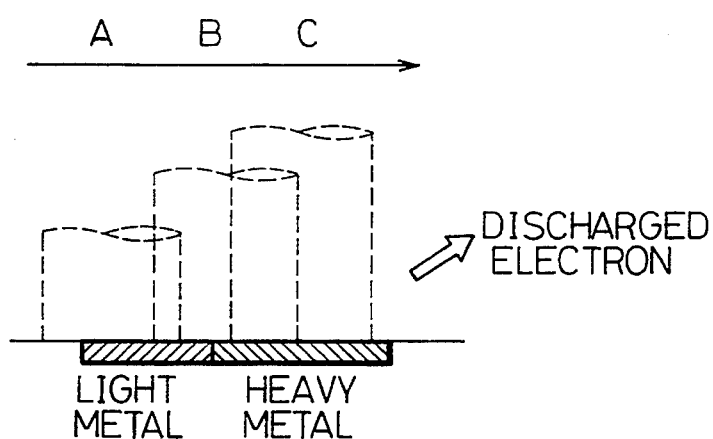
FIGS. 34(a) and 34(b) are conceptual illustrations showing another way to measure spot diameter using a light metal and a heavy metal according to another embodiment of the invention.
Figure 34B:
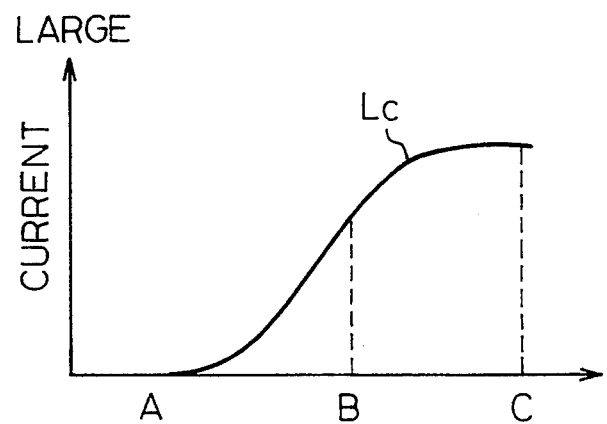

FIG. 34 illustrates another method. In FIG. 34(a), the reference pattern is formed from a combination of a light element, having a relatively small atomic weight and a heavy element, such as tantalum. The electron beam is irradiated across the pattern in the same manner. Because of the differences in atomic weight, a difference is induced in the generation of backscattered or secondary electrons so that a current variation curve Lc as shown in FIG. 34(b) is obtained while shifting the beam from position A to the position C. Similarly to the knife edge method, the curve varies swiftly across position B. Then, with the differentiated values, a differentiation curve similar to FIG. 33(c) can be obtained for measuring the spot diameter.

The foregoing examples of a practical measurement of the spot diameter are adapted for a single electron beam. The spot diameters of a plurality of electron beams can be measured using the process illustrated in FIG. 35.

Figure 35A:
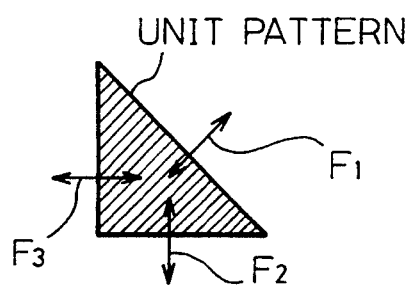
FIGS. 35(a) to 35(c) are illustrations showing an embodiment of the pattern inspection apparatus according to the invention.

FIG. 35(a) illustrates a preferred plane configuration of the unit pattern. Here, by utilizing a triangular unit pattern, the electron beams are scanned in the three directions $F_1$ to $F_3$ respectively perpendicular to the three edges of the triangle. By this method, the pure circular spot diameter of the electron beam can be accurately measured. This method also permits a measurement of longer and shorter axes of an elliptic spot causing astigmatism.

Now, it is assumed that for respective unit patterns $P_1$ to $P_5$ forming a random unit pattern, electron beams $B_1$ to $B_5$ respectively having different spot diameters are irradiated. The scanning direction is set at $F_l$. The differentiation curves of beam currents of respective unit patterns are shown in FIG. 35(c). $L_1$ shows the differentiation curve corresponding to the electron beam $B_1$. $L_2$ shows the differentiation curve corresponding to the electron beam $B_2$. Similarly, with respect to the electron beams $B_3$ to $B_5$, the differentiation curves $L_3$ to $L_5$ are obtained.

Comparing these curves $L_1$ to $L_5$, curve $L_5$ corresponding to the electron beam $B_3$ having the smallest diameter has the minimum width and the highest peak. Conversely, for curve $L_4$ corresponding to the electron beam $B_4$ having the largest spot diameter, the width attains the maximum value and the peak attains the lowest value. The differences between the curve $L_5$ corresponding to the minimum diameter and other curves $L_1$–$L_4$ correspond to the differences of the spot diameters. Accordingly, by utilizing such differences in the curves, correction values for the spot diameters for respective electron beams can be derived.

Figure 35B:
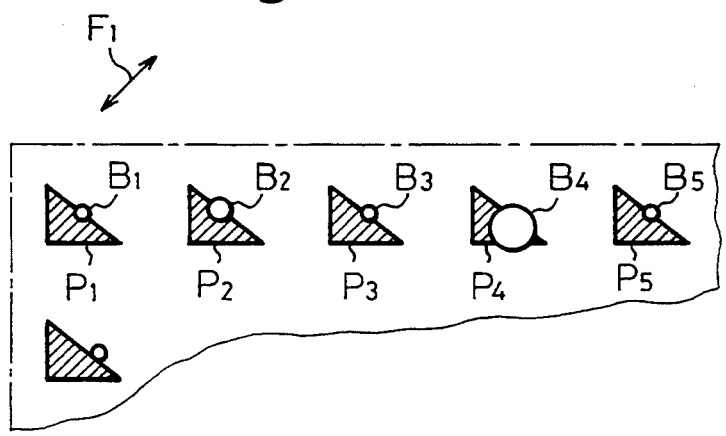
Figure 35C:
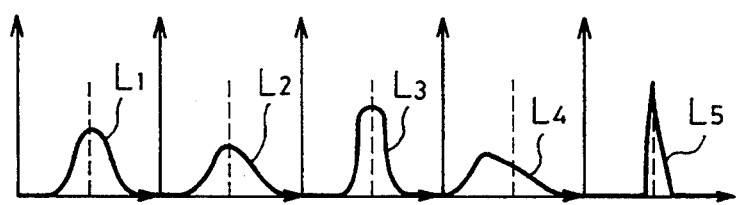

On the other hand, as can be seen from FIG. 35(b), the beam axis (spot center) of the electron beam $B_4$ is slightly offset from the center of the oblique edge. Accordingly, by using such offset amount of peak position, a correction value for the offset of the beam axes for a respective electron beam can be derived.

As the unit pattern, it is possible to use a stencil type pattern with openings. In such a case, it is desirable to provide current measuring devices, such as Farady cups, beneath the openings.

Furthermore, as the above-mentioned circuit $C_i$, it is also preferable to use a variable power source device, such as a voltage regulator circuit, or a programmable power source or the like. In the former case, the correction value for the spot diameter or the beam axis offset is provided for the reference voltage, and in the latter case, the correction value is provided for the program input.

Furthermore, in the case that the subject of correction is of an electromagnetic type, the above-mentioned circuit $C_i$ becomes the current source. In such a case, using resistance division, the current from the current source is appropriately divided. Namely, in the shown embodiment, the diameter and configuration of a respective beam can be independently measured so that the voltage or current to be applied to the electrode can be adjusted based on the result thereof, thereby making it possible to adjust the beam diameters of the electron beams so that they are substantially equal to each other.

In the above embodiment, a resistor network is used for precisely controlling the supplied voltage to the converging electrode, but in the present invention, another switching means comprising a plurality of transistors also can be used as an alternative device instead of the resistor network.

Figure 44:
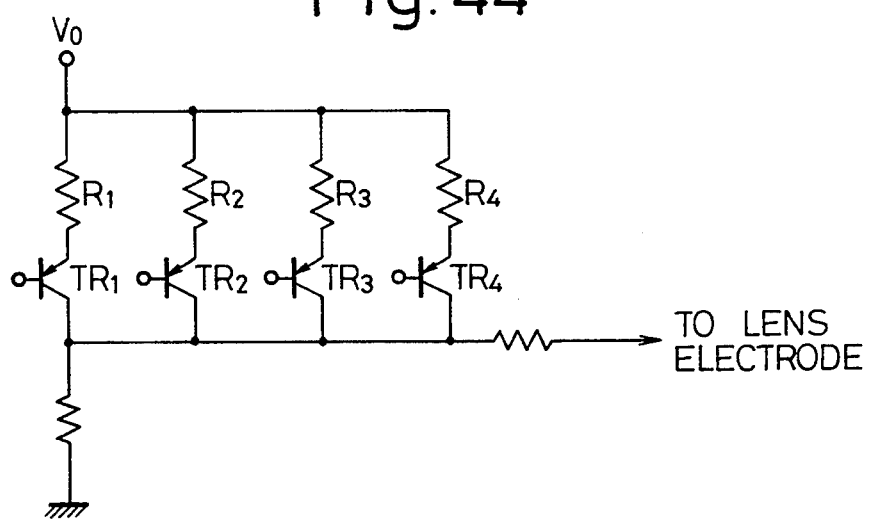
FIG. 44 is an illustration showing a switching circuit used in the present invention.

FIG. 44 shows a switching circuit comprising a plurality of transistors TR1, TR2, TR3 and TR4, which can be used for precisely controlling the voltage supplied to the converging electrode Edi.

Although in the previous embodiment, the control function can be carried out by cutting or connecting the resistor or resistors in the resistor network, in this transistor embodiment, the control thereof can be carried out by controlling each one of these transistors in an ON/OFF condition.

Figure 45:
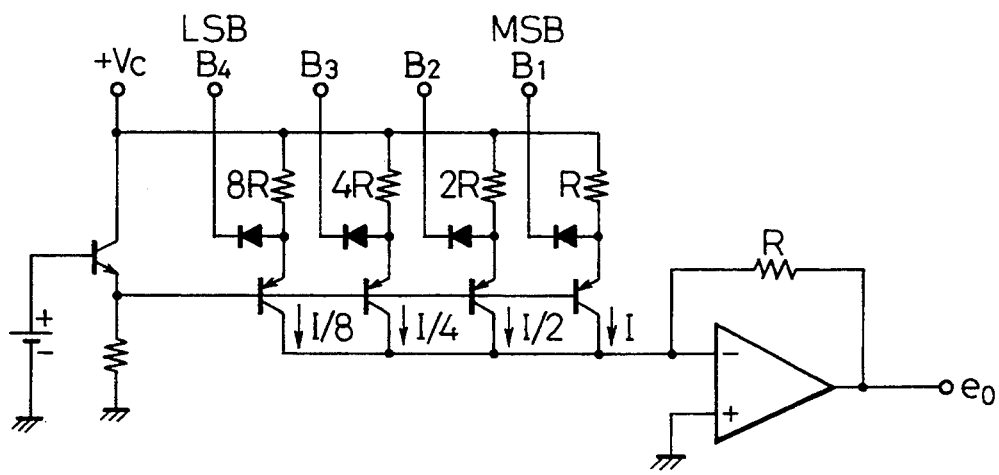
FIG. 45 is an illustration showing another type of switching circuit used in the present invention.

A digital-analog converter can be used as a typical type of switching circuit and one of the representative circuit constructions therefore is shown in FIG. 45 which is known as a weighing constant current type digital-analog converter.

In this circuit, the input terminals comprise four bits B1 to B4 and thus the controlling operation can be carried out by applying any one of the control signals as 1 or 0, respectively, and accordingly the output will be as follows;

$$VO = RI(B1/2 + B2/2^2 + B3/2^3 + B4/2^4)$$

Since there is an upper limit in the number of bits in a DAC in practical use, the range of correction can be limited when the resolution is set excessively high. Therefore, it is desirable to combine DAC adjustment in combination with resistor adjustment. In this way, incremental adjustment capability is achieved while maintaining a large adjustment range.

Figure 46:
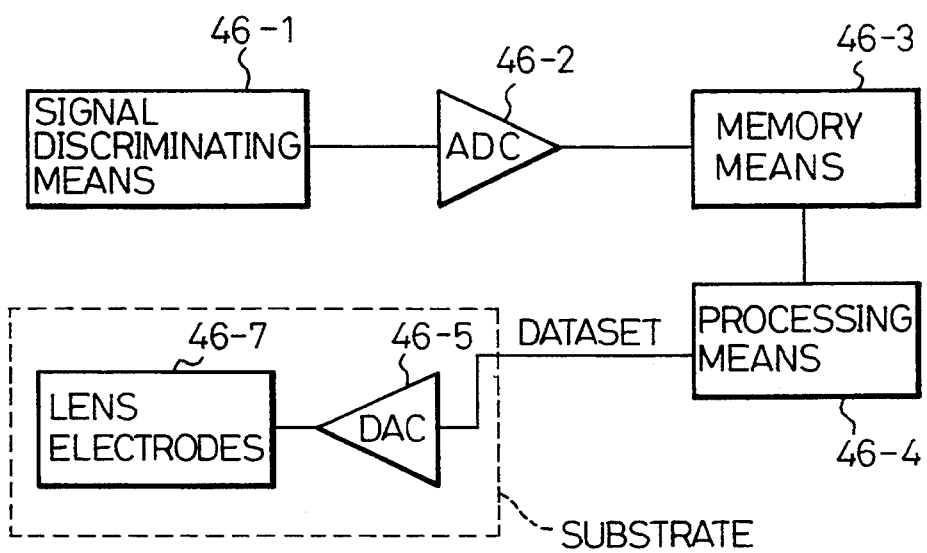
FIG. 46 is an illustration showing a real time controlling circuit used in the present invention.

Further, in the present invention as explained in connection with the above embodiment, the adjustment of the beam configuration can be carried out on a real-time basis, and thus FIG. 46 shows one example of a controlling circuit for adjusting beam configuration in real-time.

The circuit of FIG. 46 comprises a signal discriminating portion 46-1 which corresponds to the signal discrimination portion 354 as shown in FIG. 20, an analog-digital convertor 46-2 and a digital-analog convertor 46-5, a memory means 46-3, a processing means 46-4, and a plurality of lens electrodes 46-7.

In this circuit, the signals output from each of the detectors is discriminated by the signal discriminating portion 46-1 and then each of the signal wave forms as shown in FIG. 35 is digitized by the analog-digital convertor 46-2 and stored in the memory means 46-3.

The processing means 46-4 then processes the stored data to produce controlling data for adjusting the voltage of the conversion lens and such controlling data is output to the digital-analog convertor 46-7 provided on a substrate from which analog controlling data is output to the lens electrode.

In the present invention, variations in beam deflection can also adjusted utilizing the above circuit.

As can be appreciated, according to the shown embodiment, since the characteristics of a plurality of electron beams can be independently adjusted, the characteristics of the overall electron beams can be precisely made uniform so as to avoid fluctuation of the spot diameters, offset of the beam axes, or fluctuation of the deflection angles.

In addition, the shown embodiment can be used to effectively avoid interference between backscattered electrons from adjacent irradiation regions. Or, as an alternative, the degradation of the S/N ratio due to interference by reflected beams from adjacent regions can be successfully compensated for with the following embodiment.

Figure 42A:
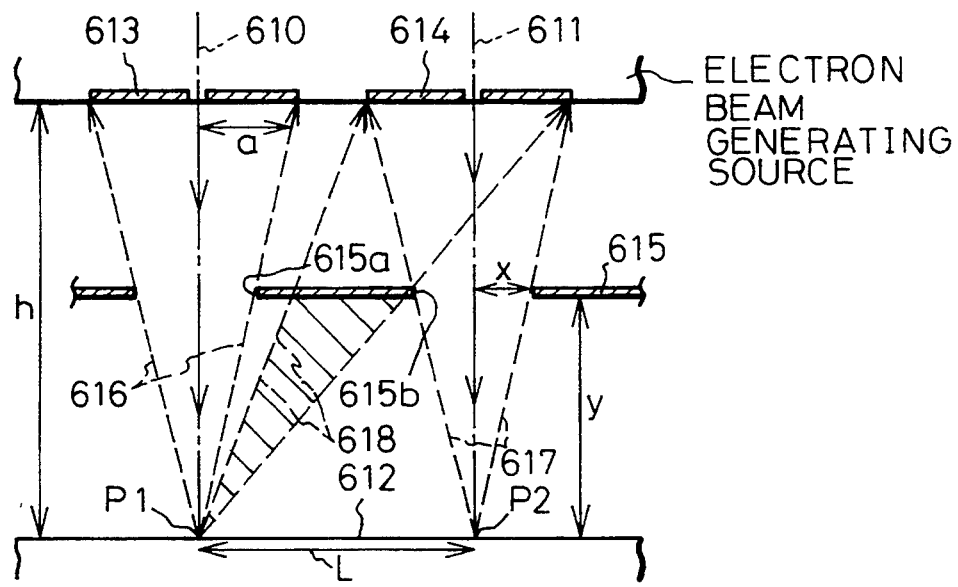
Figure 42B:
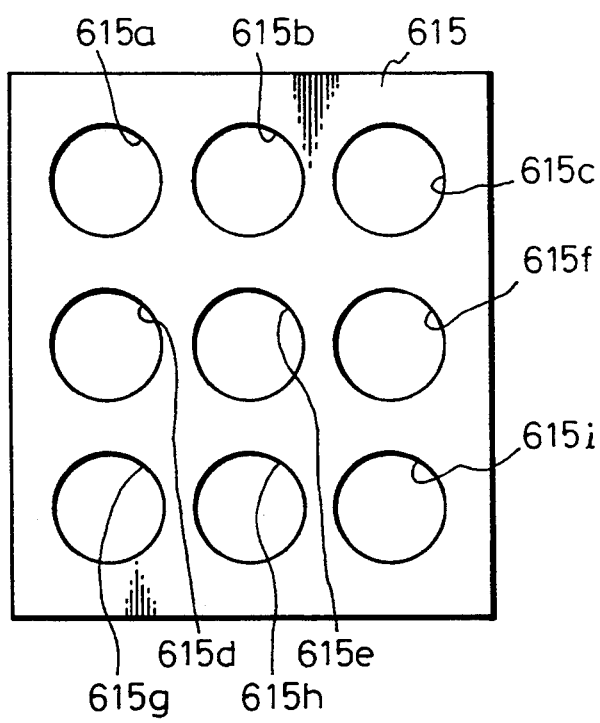
Figure 42C:
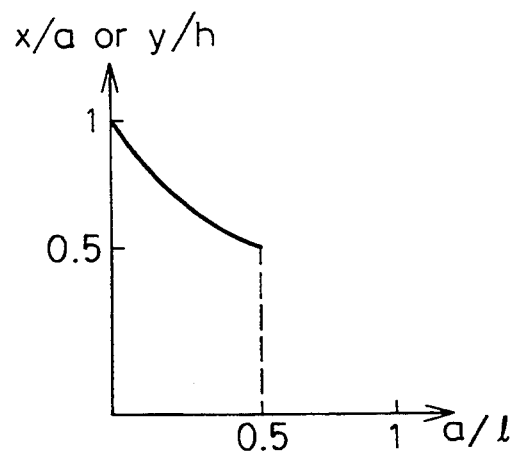

In order to improve the S/N ratio, another embodiment according to the invention is constructed as shown in FIG. 42. The FIG. 42 embodiment of the pattern inspection apparatus according to the present invention includes a plurality of electron emitters arranged in a parallel relationship and in a matrix. Each of the emitters is provided with a fine electrode with a sharply headed tip end, a gate surrounding the tip end of the fine electrode, a converging electrode, a deflection electrode and a detector. Electron beams are simultaneously irradiated on the surface of the sample from the parallel electron emitters. The backscattered or secondary electrons from the surface of the sample are caught by a detecting surface of each detector. Based on the amount of backscattered or secondary electrons, the condition of the surface of the sample is determined. A mask having an opening with a predetermined internal diameter is arranged so that the center of the opening is aligned with the axis of the electron beam, at a position between the surface of the sample and the detecting surface of the detector which is determined based on the distance from the surface of the sample to the detecting surface and the size of the detecting surface.

The practical construction of the FIG. 42 embodiment will be discussed with reference to FIG. 35.

In FIG. 42(a), an electron beam 610 is emitted from one of a plurality of electron emitters and an electron beam 611 is emitted from an adjacent electron emitter. The electron beams 610 and 611 are simultaneously irradiated onto two points $P_1$ and $P_2$ which are spaced apart by a distance L. The electrons (or secondary electron) are emitted from the points $P_1$ or $P_2$.

The reference numerals 613 and 614 denote detectors provided in the vicinity of the outlets of the electron beams 610 and 611. These detectors 613 and 614 catch the backscattered or secondary electrons of the corresponding electron beam on a surface having a given area so as to output an electric signal proportional to the amount of electrons caught.

Between the detectors 613 and 614 and the sample 612, a mask 615 with openings is provided. The mask 615 is formed with a number of circular openings (for example, nine openings 615a to 615i as shown) corresponding to the number of electron beams. The center of each circular opening (for example, openings 615a and 615b) is precisely aligned with the axis of the corresponding electron beams (for example 610 and 611).

The preferred position of the mask 615 with the openings therein is derived through the following manner. Assuming that the distance from the surface of the sample 612 to the detectors 613 and 614 is h, the distance from the surface of the sample 612 to the mask 615 is y, the radius (corresponding to the size of the detecting surface) of the detecting surface of the detectors 613 and 614 is a, the radius of the openings 615a to 615i of the mask is x, the distance between the irradiating points $P_1$ and $P_2$ of the electron beams is L, then the position of the mask 615 is selected so that either x/a or y/h is in the range of from 1.0 to 0.5 and a/L is in range of from 0 to 0.5 (refer to FIG. 42C).

For example, when the distance between the detectors 613 and 614 is substantially 0, a/L becomes 0.5. Therefore, in such a case, the preferred position of the mask 615 is determined so that x/a or y/h is 0.5. Therefore, the position of the mask 615 is selected so as to place the circular opening having a radius x, which is approximately one half of the radius of the detecting surface, at approximately an intermediate position (y/h=0.5) of the distance between the surface of the sample 612 and the detectors 613 and 614 (y/h=0.5).

It should be appreciated that FIG. 42(a) shows an example for the case where a/L m x/a x y/h x 0.5. In this example, the backscattered electrons 616 backscattered from the point $P_1$ toward the detector 613 and the backscattered electrons 617 backscattered from the point $P_2$ toward the detector 614 can pass through the circular openings 615a and 615b. However, backscattered electrons from an adjacent irradiation region, such as the backscattered electrons 618 backscattered from the point $P_1$ toward the detector 614, are blocked from passing through opening 615b by the solid portions of mask 615. Accordingly, with the shown embodiment, inpurgement of backscattered electrons from an adjacent irradiation region to a given detector can be positively eliminated to enhance the accuracy of detection.

Figure 36:
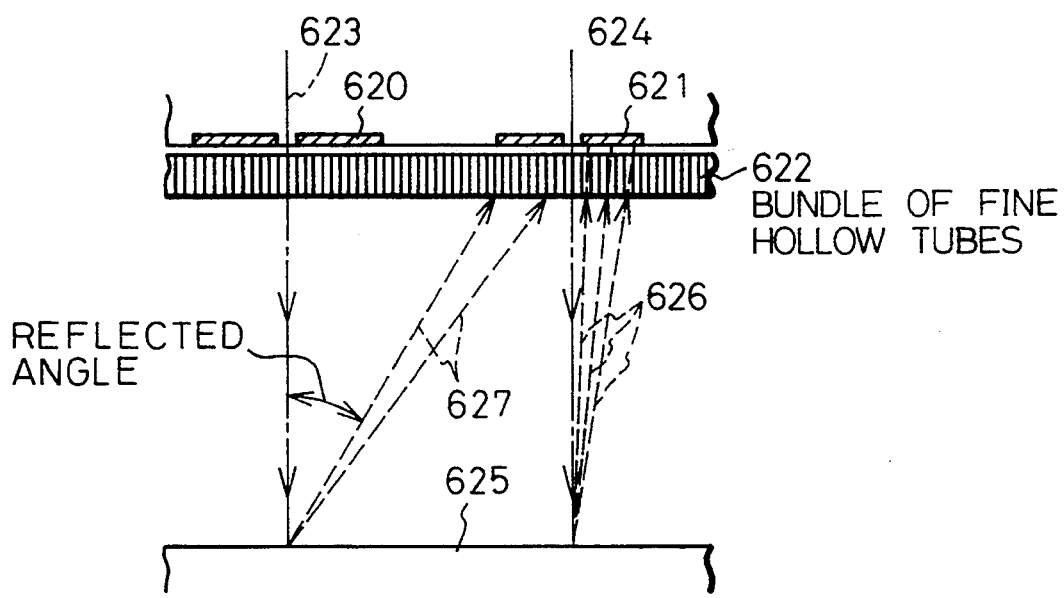
FIG. 36 is an illustration showing an embodiment of the pattern inspection apparatus according to the invention.

Next, a fifth embodiment of the present invention will be discussed. The fifth embodiment is illustrated in FIG. 36, in which, the shown embodiment of the pattern inspection apparatus comprises a plurality of electron emitters arranged in a matrix fashion. Each of the electron emitters includes a fine electrode with a sharp headed tip end and a gate surrounding the tip end of the fine electrode. A converging electrode, a deflection electrode and a detector is provided for each of the electron emitters. Parallel electron beams are emitted from the electron emitters simultaneously so as to irradiate the surface of the sample. Backscattered or secondary electrons are caught by the detecting surface of the detectors provided for each of the electron beams.

Based on the amount of the backscattered or secondary electrons captured by the detectors, the condition of the surface of the sample is determined. A plurality of thin tubes having a predetermined length are provided in an orientation such that the longitudinal axes thereof are in parallel alignment with the axes of the electron beams.

In a practical construction, as shown in FIG. 36, a bunch of thin tubes is arranged in the proximity of the detectors (only detectors 620 and 621 are shown in the drawing). As said thin tube, a lead glass tube of 20 $\mu m\phi$, which is used in an electron multiplier for MPC (microchannel plate) or so forth, is available. In the electron multiplier, the tube is slightly inclined relative to the axis of the electron beam so that the electrons collide on the inner periphery of the tube to provide energy corresponding to the potential of the inner wall for the backscattered electrons. Conversely, in the shown embodiment, the tubes are provided precisely in alignment with the axis of the electron beam and no potential is provided for the inner wall.

With such an arrangement, the electron beams (typically 623, 624) can be irradiated on the sample 625 without any interference. On the other hand, only those backscattered electrons having a reflection angle smaller than or equal to a given angle are permitted to pass through the tube. Therefore, backscattered electrons from an adjacent irradiation region (which has too large a reflection angle) will not enter a given tube. Therefore, interference by backscattered electrons from an adjacent irradiation region can be positively prevented. As can be appreciated, the reflection angular range to permit passing through the tubes can be easily adjusted by selecting the diameter and length of the tubes.

Figure 37:
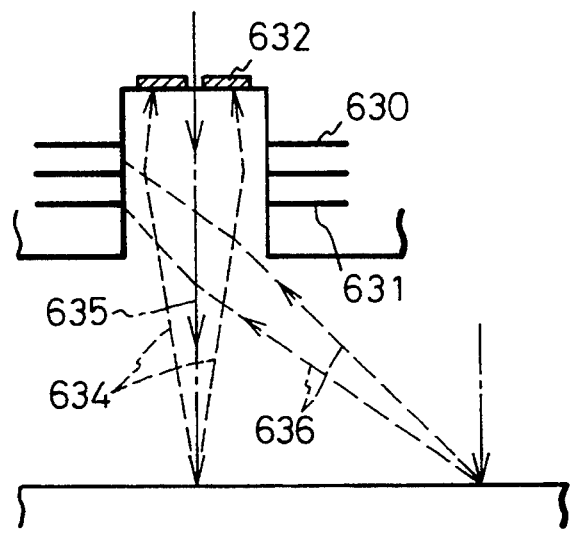
FIG. 37 is an illustration showing an arrangement of an embodiment of a detection element of the invention.

FIG. 37 shows a sixth embodiment of the invention, in which embodiment the pattern inspection apparatus comprises a plurality of electron emitters arranged in a matrix fashion. Each of the electron emitters includes a fine electrode with sharp headed tip end and a gate surrounding the tip end of the fine electrode. A converging electrode, a deflection electrode and a detector are provided for each of the electron emitters. Parallel electron beams are emitted from the electron emitters simultaneously and irradiate the surface of the sample. The backscattered or secondary electrons 634 from each beam 635 are caught by the detecting surface of the detectors 632. Based on the amount of the backscattered or secondary electrons captured by the detectors, the condition of the surface of the sample is determined. The detectors are arranged between the converging and deflecting electrodes and the electron emitter.

As shown in FIG. 37, the detector 632 is positioned between the electron lens system comprising the converging electrode 630 or the deflection electrode 631 and the electron emitter.

With such construction, the backscattered electrons 634 from the focus point of the electron lens system are deflected so as to be substantially parallel to the electron beam 635 applying the principle of a convex lens and thus can easily reach the detector 632. Conversely, the backscattered electrons 636 from the focus point of an adjacent electron lens system intersect with the axis of the electron beam 635 and are unable to reach the detector 632. Therefore, with the shown arrangement, the precision in detection can be enhanced.

FIGS. 38 to 41 show a seventh embodiment of the invention in which the pattern inspection apparatus comprises a plurality of electron emitters arranged in a matrix fashion. Each of the electron emitters includes a fine electrode with sharp headed tip end and a gate surrounding the tip end of the fine electrode. A converging electrode, a deflection electrode and a detector are provided for each of the electron emitters. Parallel electron beams are emitted from the electron emitters simultaneously so as to irradiate the surface of the sample. The backscattered or secondary electrons are captured by the detecting surface of the detector provided for each electron beam. Based on the amount of the backscattered or secondary electrons captured by the detectors, the condition of the surface of the sample is determined. The detected value of a given detector is processed by subtracting a value derived by multiplying respective signals of a plurality of surrounding detectors by a predetermined coefficient.

Figure 38:
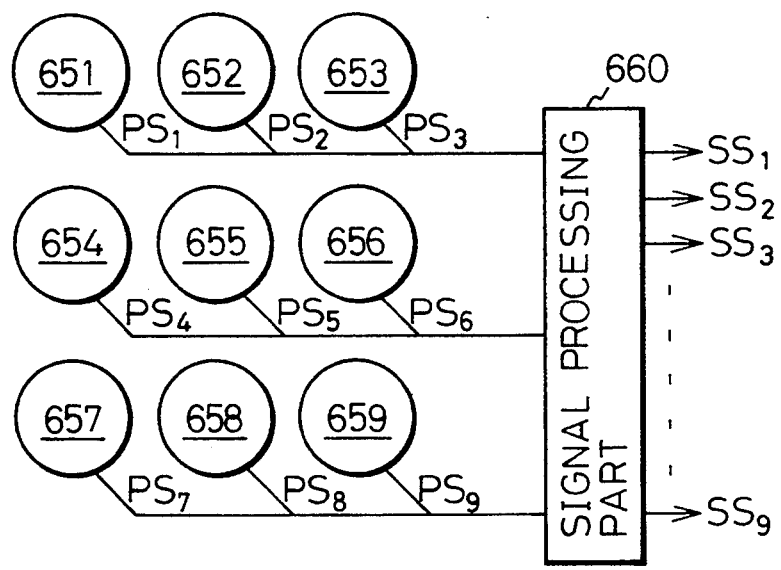
FIG. 38 is an illustration showing an example of the arrangement of a detection device according to an embodiment of the invention.

As shown in FIG. 38, the reference numerals 651 to 659 denote respective detectors provided for corresponding electron emitters arranged in a matrix array. The detectors 651 to 659 are arranged in regular incremental intervals. The detection signals $PS_{651}$ to $PS_{659}$ are provided to the signal processing section 660. The signal processing section 660 effects a predetermined signal processing operation to output corrected detection signals $SS_1$ to $SS_9$.

Figure 39:
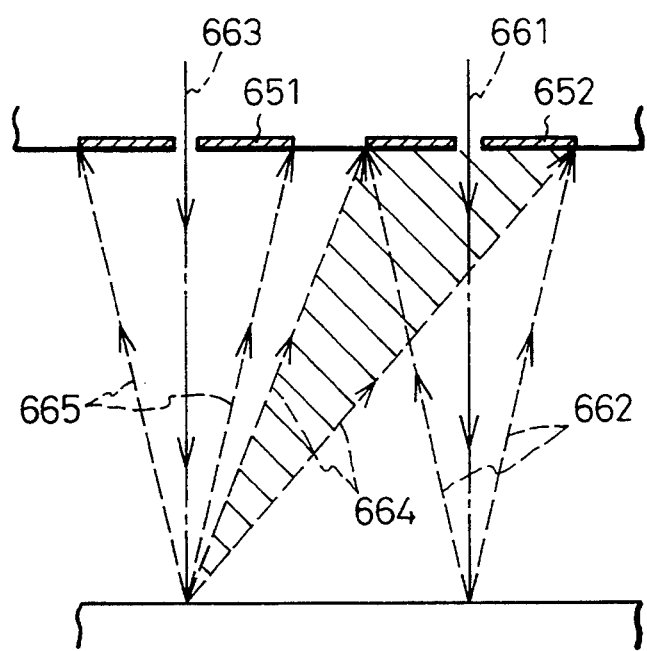
FIG. 39 is an illustration showing an embodiment of the pattern inspection apparatus according to the invention.

FIG. 39 is an illustration showing an embodiment of the pattern inspection apparatus according to the invention.

Here, considering two adjacent detectors (for example, detectors 651 and 652 of FIG. 38), one of the detectors (for example 652) catches backscattered electrons 662 of the electron beam 661 from its own electron beam generating source and also catches backscattered electrons 664 of the electron beam 663 from the electron beam generating source corresponding to the adjacent detector 651. Then, by the presence of the backscattered electrons 664, the S/N ratio of the detector 652 is degraded. The S/N ratio of the detector 652 is further degraded by the influence of a plurality of adjacent electron beams.

The detection signals $PS_{651}$ and $PS_{652}$ the detectors 651 and 652 are expressed by the following equations:

$$PS_{651}=SS_{651}+N_{652} \qquad (1)$$

$$PS_{652}=SS_{652}+N_{651} \qquad (2)$$

where $SS_{651}$ is a value corresponding to the amount of backscattered electrons 665 of the electron beam 663, and $SS_{652}$ is a value corresponding to the amount of backscattered electrons 662 of the electron beam 661, these values being the true values to be detected. $N_{651}$, is a value corresponding to the amount of backscattered electrons 664 of the electron beam 663 and $N_{651}$ corresponds to the amount of electrons (not shown) of the electron beam 661, and these values serve to cause degradation of the S/N ratio by being superimposed on the true values.

$N_{651}$ is proportional to the amount $SS_{651}$ of the backscattered electrons 665, as expressed by the following equation (3), and $N_{652}$ is proportional to the amount $SS_{652}$ of the backscattered electrons 662, as expressed by the following equation (4). Namely, the values $N_{651}$ and $N_{652}$ will increase according to an increase in the amount of backscattered electrons 665 and 662.

$$N_{651}=k \cdot SS_{651} \qquad (3)$$

$$N_{652} = k \cdot SS_{652} \quad (4)$$

k in the foregoing equations (3) and (4) is a coefficient between $N_{651}$ and $S_{651}$ and between $N_{652}$ and $SS_{652}$. The amount of this coefficient k is determined according to the positional relationship between the detectors 651 and 652. For instance, when two detectors 651 and 652 are close together, k becomes large, and when these detectors are far apart, k becomes smaller. It should be noted that the coefficient between $N_{651}$ and $SS_{651}$ is not the same as that between $N_{652}$ and $SS_{652}$, in a strict sense, because of tolerances of the detectors. However, the use of a typical coefficient k derived on the basis of average design data which takes into consideration the distance between the detectors and the size of the detecting surfaces will not create a problem.

Using the foregoing equations (1) through (4), the following equations (5) and (6) can be established.

$$PS_{651} = (a - k^2) \cdot SS_{651} + k \cdot PS_{652} \quad (5)$$

$$PS_{652} = (a - k^2) \cdot SS_{651} + k \cdot PS_{652} \quad (6)$$

And since k is less than 1, $$PS_{651} \approx SS_{651} + k \cdot PS_{652} \, \Delta SS_{651} \approx PS_{651} - k \cdot PS_{652} \quad (7)$$

$$PS_{652} \approx SS_{652} + k \cdot PS_{651} \, \Delta SS_{652} - PS_{652} - k \cdot PS_{651} \quad (8)$$

Accordingly, in order to obtain the true signal $SS_{651}$ by removing the noise component $N_{652}$ from the detection signal $PS_{651}$ of the detector 651, the value is derived by multiplying the detection signal value $PS_{652}$ of the detector 652 by the coefficient k from the detection signal $PS_{651}$ of the detector 651. Similarly, in order to obtain the true signal $SS_{652}$ by removing the noise component $N_{651}$ from the detection signal $PS_{652}$ of the detector 652, the value is derived by multiplying the detection signal value $PS_{651}$ of the detector 651 by the coefficient k from the detection signal $PS_{652}$ of the detector 652.

Figure 40A:
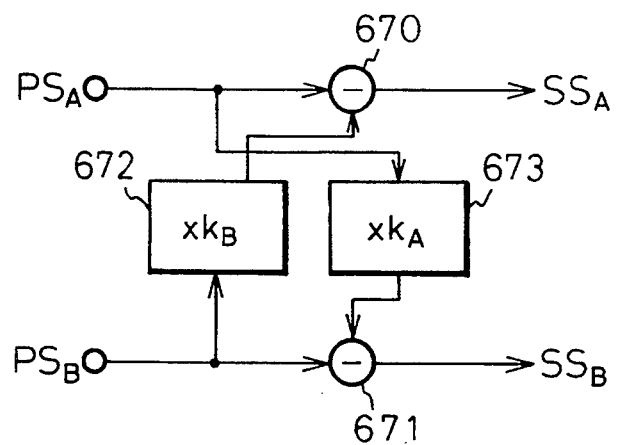
FIGS. 40(a) and 40(b) are illustrations showing the construction of a signal processing section in an embodiment of the pattern inspection apparatus of the invention.
Figure 40B:
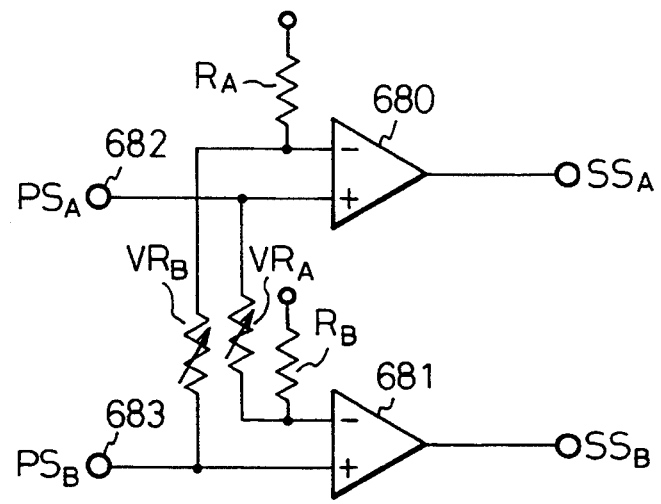

FIG. 40 is a block diagram showing a circuit for performing the foregoing subtraction process. In this example, as shown in FIG. 40(a), the circuit comprises two subtractors 670 and 671 and two multipliers 672 and 673. The multiplier 673 multiplies the detection signal PSA by a coefficient kA. The subtractor 671 subtracts the product obtained by the multiplier 673 from the detection signal PSB to derive the true detection signal SSB. Similarly, the multiplier 672 multiplies the detection signal PSB by a coefficient kB. The subtractor 670 subtracts the product obtained by the multiplier 672 from the detection signal PSA to derive the true detection signal SSA. In the preferred construction as shown in FIG. 40b, the subtractors are formed by operational amplifiers 680 and 681. The inverting inputs (−) of the operational amplifiers 680 and 681 are input via resistors $R_A$ and $R_B$ at locations between respective inverting inputs (−) and the detection signal input terminals 682, 683 variable resistors $VR_A$ and $VR_B$ may be used to interconnect amplifiers 680 and 681 and the setting of resistors $VR_A$ and $VR_B$ determines the coefficients value of the $k_A$ and $K_B$.

In the foregoing example, discussion has been provided for the case where two detection signals are processed. However, in the practical implementation of pattern inspection apparatus according to the present invention, a greater number of detection signals must be processed.

For example, FIG. 38 shows an example in which 9 detectors 651 to 659 are provided. In this example, several groups are formed with the detectors having a positional relationship so as to have equal coefficients with respect to the specific detector (for example, detector 655 of FIG. 38) for which a true detection signal is to be obtained. In the shown example, the detectors 652, 654, 656 and 658 form one group that will hereafter be referred to as group a, and the detectors 651, 653, 657 and 659 form another group hereafter referred to as group B. The detection signals of the detectors in each group are summed. The sum thus calculated is multiplied with a coefficient which is common for the detectors in the group. Namely, in the shown case, the sum of the detection signals in the group a is multiplied by the coefficient kα. The product thus derived is subtracted from the detector signal $PS_{655}$ of the detector 655 to derive the true detector signal value. This process is expressed by the following equation (9):

$$SS_{655} = PS_{655} - k\alpha, \, \epsilon PS\alpha - k\beta \cdot \epsilon PS\beta \quad (9)$$

where $$\epsilon PS\alpha = PSS_{652} + PS_{654} + PS_{656} + PS_{658}$$

$$\epsilon PS\beta = PS_{651} + PS_{653} + PS_{657} + PS_{659}$$

In the foregoing equation (9), the common equations kα and kβ are used for the detector signals of the detectors positioned respectively at equal distance from the specific detector for which a true detection signal $SS_{655}$ is to be derived.

If different coefficients are used, the following equation (10) is established:

$$SS_{655} = PS_{655} - k_{651-655} \cdot PS_{651} - k_{652-655} \cdot PS_{652} - \quad (10)$$
$$k_{653-655} \cdot PS_{653} - k_{654-655} \cdot PS_{654} \ldots - k_{659-655} \cdot PS_{659}$$

The suffix, such as 651–655, represents the coefficient between the detectors 651 and 655.

Figure 41:
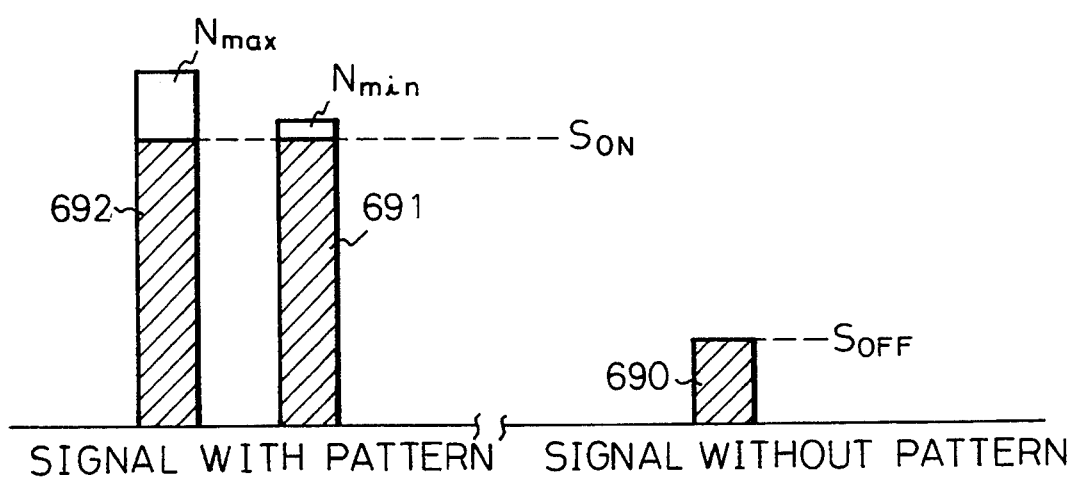
FIG. 41 is an illustration showing detection signals upon the presence and absence of a pattern.

Further discussion will be provided concerning the enhancement of the S/N ratio with reference to FIG. 41. The detection signal in the case of no pattern, at which the backscattered electrons from the irradiating region are at a minimum, is illustrated by a single bar graph 690. Conversely, the detection signal in the case where of a backscattered electrons is large, is illustrated by a double line graph 691. In addition, the hatched areas of the bar graph represent the true detection signal values which are respectively expressed as $S_{OFF}$ (pattern absent) and S/N (pattern present).

Now, consideration is provided for the case where the pattern is present. In this case, assuming that the backscattered electrons of the adjacent electron beam are at a zero value, the signal $S_{ON}$ corresponding to the hatched portion of the bar graph 691 (or 692), namely the true detection signal, can be obtained when the backscattered electrons of the adjacent electron beam are included in the detection signal as a noise component. In this case, when all of the adjacent irradiation regions have patterns, the maximum noise component ($N_{max}$) should be superimposed on the true detection signal. On the other hand, when all of the adjacent irradiating regions have no patterns, the minimum noise component ($N_{min}$) is superimposed on the true detection signal. The following equation expresses the S/N ratio of the case of FIG. 41.

$$S/N = (S_{ON} - S_{OFF})/(S_{ON} + \text{"N"} - S_{ON}) \tag{11}$$

In the foregoing equation "N" is to be replaced for $N_{max}$ to $N_{min}$. The greater N value will degrade the S/N ratio. Therefore, by setting an optimum coefficient k (it is desirable to vary such coefficient depending upon the presence and absence of the pattern) with respect to the adjacent beams to subtract the product (k·$S_{ON}$) of the coefficient k and the detection signal value of the adjacent beam from the detection signal value to compensate for the noise component, the S/N ratio can be enhanced.

It should be noted that the electron beam scanning device is applicable not only to electron beam drawing systems and electron beam inspection systems but also to plane display systems or a wide variety of electron beam utilizing products.

With the foregoing embodiment, the interference of backscattered electrons of adjacent beams can be positively prevented or successfully compensated for to obtain an enhanced S/N ratio.

Although the invention has been illustrated and described with respect to an exemplary embodiment thereof, it should be understood by those skilled in the art that the foregoing and various other changes, omissions and additions may be made therein and thereto, without departing from the spirit and scope of the present invention. Therefore, the present invention should not be understood as limited to the specific embodiment set out about but includes all possible embodiments that are within the scope encompassed and equivalents thereof with respect to the features set out in the appended claims.

We claim:

1. A pattern inspection apparatus comprising:
   an electron beam generator including a plurality of electron guns formed in one or more semiconductor substrates, each said gun being provided with an electron emitter having a sharp headed tip end, a converging electrode and a deflection electrode formed as successive substrate laminations, said generator being operable for irradiating electron beams emitted from the guns onto an inspection sample;
   a movable support for supporting said inspection sample;
   a detector including a plurality of electron detecting elements arranged on a plane perpendicular to the axis of the electron beams for detecting electrons containing construction information related to said inspection sample; and
   a signal processor for processing information output from said respective electron detecting elements simultaneously or in parallel formation.

2. A pattern inspection apparatus as set forth in claim 1, wherein said electron guns simultaneously generate electron beams.

3. A pattern inspection apparatus as set forth in claim 2, wherein said electron beams irradiate respective irradiation regions on said inspection sample.

4. A pattern inspection apparatus as set forth in claim 2, wherein two or more of said electron beams are formed into pulses having different periods.

5. A pattern inspection apparatus as set forth in claim 4, wherein said detector corrects information relating to the construction of said inspection sample irradiated by said respective beams in synchronism with pulse periods of said respective electron beams.

6. A pattern inspection apparatus as set forth in claim 5, wherein said signal processor processes said electron beams formed into pulses having mutually different pulse widths in a time division multiplexing manner.

7. A pattern inspection apparatus as set forth in claim 6, comprising an electron beam scanner including an electrostatic deflection electrode.

8. A pattern inspection apparatus as set forth in claim 7, wherein said electron beam scanner includes a mechanical scanner for shifting either said electron beam generator or said inspection sample.

9. A pattern inspection apparatus as set forth in claim 8, wherein said mechanical scanner includes a fine shifting stage that is shifted in at least one direction by actuation of a piezoelectric oscillator.

10. A pattern inspection apparatus as set forth in claim 2, wherein two or more of said electron beams are formed into pulses having mutually different pulse widths.

11. A pattern inspection apparatus as set forth in claim 10, wherein said detector detects respective pulse widths of said respective electron beams and processes information relating to the construction of said inspection sample irradiated by said respective electron beams.

12. A pattern inspection apparatus as set forth in claim 11, wherein said signal processor includes an electron flow detector and a signal discriminator for discriminating information relating to the construction at respective irradiation regions from the output signal of said electron flow detector using said modulation signal as a reference.

13. A pattern inspection apparatus as set forth in claim 2, wherein two or more of said electron beams are modulated by modulation signals having mutually distinct signal patterns.

14. A pattern inspection apparatus as set forth in claim 13, wherein said detector detects the pulse widths of the modulated electron beams and processes information relating to the construction of said inspection sample irradiated by said respective electron beams.

15. A pattern inspection apparatus as set forth in claim 13, wherein said modulation signals are pulse signals having a mutually different pulse widths and mutually identical repeating periods.

16. A pattern inspection apparatus as set forth in claim 13, wherein said modulation signals are pulse signals having mutually identical repeating periods and mutually different pulse peak timings.

17. A pattern inspection apparatus as set forth in claim 1, wherein said electron beam includes a drive mechanism for moving said generator in a plane parallel to a surface of said inspection sample.

18. A pattern inspection apparatus as set forth in claim 1, wherein said electron detecting elements are arranged in parallel relationship relative to a plane of said inspection sample and in alignment in a single dimensional direction.

19. A pattern inspection apparatus as set forth in claim 1, wherein said electron detecting elements are arranged in parallel relationship relative to a plane of said inspection sample and in alignment in two dimensional directions.

20. A pattern inspection apparatus as set forth in claim 1, wherein said detector includes a processor for performing image processing of said detected information.

21. A pattern inspection apparatus as set forth in claim 1, wherein said electron emitters operate to uniformly emit electron beams within a predetermined range, and each said gun includes structure providing fine openings arranged opposite respective irradiation portions of said inspection sample for introducing an electron beam from said electron emitter and a converging electrode for converging a respective introduced electron beam.

22. A pattern inspection apparatus as set forth in claim 1,
wherein each said electron emitter includes a fine electrode having a sharp headed tip end and a gate surrounding said tip end, said electron emitters being arranged in the form of a matrix,
said electron emitters simultaneously irradiating parallel electron beams onto the inspection sample;
said detector elements catching backscattered or secondary electrons moving from the surface of said inspection sample as a result of impingement of said electron beams thereon at respective detection surfaces,
the condition of the surface of said inspection sample being determined on the basis of the amount of backscattered or secondary electrons which are caught by said detectors,
said detector elements being arranged between said converging and deflecting electrodes and said electron emitters.

23. A pattern inspection apparatus as set forth in claim 1,
wherein said electron emitters each includes a gate surrounding said tip end, said electron emitters being arranged in the form of a matrix,
said electron emitters simultaneously irradiating parallel electron beams onto the inspection sample,
said detector elements catching backscattered or secondary electrons moving from the surface of said inspection sample as a result of impingement of said electron beams thereon at respective detection surfaces,
the condition of the surface of said inspection sample being determined on the basis of the amount of backscattered or secondary electrons which are caught by said detector elements,
the detection value of at least one of the specific detector elements being corrected by subtracting a total value from the output of said specific detector element, said total value being formed by summing up a plurality of values, each value being derived by multiplying a corresponding signal by a predetermined coefficient, to thereby eliminate information based upon secondary electrons generated from an adjacently-arranged surface of said inspection sample.

24. A pattern inspection apparatus according to claim 1, wherein said apparatus further includes an interference preventer to prevent a given detector element from being interfered with by secondary electrons generated from separate sample regions arranged adjacent a sample region corresponding to said given detector element.

25. A pattern inspection apparatus according to claim 1, wherein said apparatus further includes a processor unit for processing detected information which is detected by a given detector element, and wherein each one of the emitted electron beams is modulated, and said processor unit is further provided with a circuit, whereby the detected information can be extracted from said modulated signal, and thereafter the signal is demodulated by eliminating other detected information, and wherein said other detected information is interposed onto said detected information.

26. A pattern inspection apparatus comprising:
an electron beam generator including a plurality of electron guns formed on one or more semiconductor substrates, each said gun being provided with an electron emitter having a sharp headed tip end, a converging electrode and a deflection electrode formed as successive substrate laminations, said generator being operable for irradiating beams emitted from the guns onto an inspection sample;
a movable support for supporting said inspection sample;
a detector including a plurality of electron detecting elements, corresponding to each of said plurality of electron guns, arranged on a plane for detecting electrons containing construction information related to said inspection sample; and
a signal processor for processing information output from said respective electron detecting elements simultaneously or in parallel formation,
said electron emitters being arranged on a common substrate or on a plurality of individual substrates arranged on the same plane,
each of said electron emitters being provided with an extracting electrode for extracting charged particle beams having a beam current corresponding to an electrode voltage from said electron emitter,
said converging electrode providing a converging ratio for said charged particle beam corresponding to an electrode voltage or an energization current,
said deflection electrode providing a deflection angle to said charged particle beam corresponding to an electrode voltage or an energization current,
said detecting elements being operable for detecting all of or part of respective secondary or backscattered electrons from the surface of an inspection sample exposed to a converged and deflected charged particle beam or transmitted electrons passing through said inspection sample,
said apparatus including an adjustment unit for adjusting all of or part of respective electrode voltages or energization voltages to be applied to said extraction electrode, said converging electrode, and said deflection electrode.

27. A pattern inspection apparatus as set forth in claim 26, wherein said adjustment unit selectively adjusts the breaking and connecting of respective elements or connecting wiring of a resistor network.

28. A pattern inspection apparatus as set forth in claim 27, wherein said elements of said resistor network comprise transistors.

29. A pattern inspection apparatus as set forth in claim 26, further comprising a calculator unit for measuring spot diameters or deflection angles of charged particle beams after convergence and deflection on the basis of the signal from said detector, and calculating correction amounts for correcting all of or part of respective electrode voltages or energization currents of said extraction electrode, said converging electrode or deflection coil.

30. A pattern inspection apparatus comprising:

a plurality of electron emitters, each including a fine electrode having a sharp headed tip end and a gate surrounding said tip end, said electron emitters being arranged in the form of a matrix;

a converging electrode, a deflection electrode and a detector for each of said electron emitters, said electron emitters simultaneously irradiating parallel electron beams onto an inspection sample, said detectors catching backscattered or secondary electrons from the surface of said inspection sample with respect to each of said electron beams at respective detection surfaces, the condition of the surface of said inspection sample being determined on the basis of the amount of backscattered or secondary electrons which are caught by said detectors; and a mask having openings with predetermined internal diameters, said mask being arranged so as to align the centers of openings with the axes of respective electron beams at a predetermined position between the surface of said inspection sample and said detection surfaces, said mask being placed at a distance from said surface of said inspection sample that is calculated utilizing a distance between said surface of said inspection sample and said detecting surfaces and the size of said detecting surface.

31. A pattern inspection apparatus comprising:

a plurality of electron emitters, each including a fine electrode having a sharp headed tip end and a gate surrounding said tip end, said electron emitters being arranged in the form of a matrix;

a converging electrode, a deflection electrode and a detector for each of said electron emitters, said electron emitters simultaneously irradiating parallel electron beams onto an inspection sample, said detectors catching backscattered or secondary electrons moving from the surface of said inspection sample as a result of impingement of said electron beams thereon at respective detection surfaces, the condition of the surface of said inspection sample being determined on the basis of the amount of backscattered or secondary electrons which are caught by said detectors; and a plurality of thin tubes respectively having a predetermined length and being arranged so that the longitudinal axes of said thin tubes extend parallel to the beam axes of said electron beams.

32. An electron beam apparatus comprising:

a plurality of electron emitters, each including a fine electrode having a sharp headed tip end and a gate surrounding said tip end, said electron emitters being arranged in the form of a matrix;

a converging electrode, a deflection electrode and detector for each of said electron emitters, said electron emitters simultaneously irradiating parallel electron beams onto an inspection sample, said detectors catching backscattered or secondary electrons from the surface of said inspection sample with respect to each of said electron beams at respective detection surfaces, the condition of the surface of said inspection sample being determined on the basis of the amount of backscattered or secondary electrons which are caught by said detectors; and a mask having openings with predetermined internal diameters, said mask being arranged so as to align the centers of the openings with the axes of said electron beams at a predetermined position between the surface of said inspection sample and said detection surfaces, said mark being placed at a distance from said surface of said inspection sample which is calculated utilizing a distance between said surface of said inspection sample and said detecting surface, and the size of said detecting surface.

33. An electron beam apparatus comprising:

a plurality of electron emitters, each including a fine electrode having a sharp headed tip end and a gate surrounding said tip end, said electron emitters being arranged in the form of a matrix;

a converging electrode, a deflection electrode and a detector for each of said electron emitters, said electron emitters simultaneously irradiating parallel electron beams onto an inspection sample, said detectors catching backscattered or secondary electrons moving from the surface of said inspection sample as a result of impingement of said electron beams thereon at respective detection surfaces, the condition of the surface of said inspection sample being determined on the basis of the amount of backscattered or secondary electrons which are caught by said detectors; and a plurality of thin tubes respectively having predetermined lengths and being arranged so that the longitudinal axes of said thin tubes extend parallel to the beam axes of said electron beams.

34. An electron beam inspection apparatus comprising:

a plurality of electron emitters, each including a fine electrode having a sharp headed tip end and a gate surrounding said tip end, said electron emitters being arranged in the form of a matrix; and a converging electrode, a deflection electrode and a detector for each of said electron emitters, said electron emitters simultaneously irradiating parallel electron beams onto an inspection sample, said detectors catching backscattered or secondary electrons moving from the surface of said inspection sample as a result of impingement of said electron beams thereon at respective detection surfaces, the condition of the surface of said inspection sample being determined on the basis of the amount of backscattered or secondary electrons which are caught by said detectors, said detectors being arranged between said converging and deflecting electrodes and said electron emitters.

35. An electron beam apparatus comprising:

a plurality of electron emitters, each including a sharp headed tip end and a gate surrounding said tip end, said electron emitters being arranged in the form of a matrix; and a converging electrode, a deflection electrode and a detector for each of said electron emitters, said electron emitters simultaneously irradiating parallel electron beams onto an inspection sample, said detectors catching backscattered or secondary electrons moving from the surface of said inspection sample as a result of impingement of said electron beams thereon at respective detection surfaces, the condition of the surface of said inspection sample being determined on the basis of the amount of backscattered or secondary electrons that are caught by said detectors, the detection value of one of the detectors being corrected by subtracting a total value from the output of said one detector, said total value being formed by summing up a plurality of values, each said value being derived by multiplying a corresponding signal by a predetermined coefficient to thereby eliminate information based upon electrons moving from an adjacently-arranged surface of said inspection sample.

36. An electron beam apparatus for inspecting integral circuit patterns formed on an inspection sample comprising a semiconductor wafer, said apparatus comprising:

a plurality of electron emitters for generating electron beams, said emitters being arranged in the form of a matrix and each including a fine electrode having a sharp headed tip end and a gate surrounding said tip end;

accelerating electrodes for accelerating said electron beams to a predetermined energy;

converging electrodes for converging each of said electron beams into a predetermined diameter;

detectors for detecting backscattered or secondary electrons with respect to each of said electron beams;

a collimating unit for collimating backscattered or secondary electrons generated from a specific region of said inspection sample to a respective specific detector, and preventing each specific detector from being interfered with by other backscattered or secondary electrons generated from separate sample regions arranged adjacent said specific region, said electron emitters, said accelerating electrodes, said converging electrodes, said detectors and said collimating unit being formed as laminations in a semiconductor substrate; and a signal processing unit for processing information output from respective detectors, simultaneously or in parallel formation.

37. An electron beam apparatus as set forth in claim 36, wherein said collimating unit comprises a mask having an opening with a predetermined internal diameter, said mask being arranged so as to align the center of said opening with the axis of a corresponding electron beam at a position between the inspection sample and a corresponding detector, said mask being located at a distance from the inspecting sample having a magnitude derived based on the distance between the surface of the inspection sample and a corresponding detector and the size of the detector.

38. An electron beam apparatus as set forth in claim 36, wherein said collimating unit comprises a plurality of thin tubes respectively having predetermined lengths and being arranged so that the longitudinal axes of said thin tubes extend parallel to the beam axes of said electron beams.

39. An electron beam apparatus as set forth in claim 36, wherein said signal processing unit includes means for correcting the detection value of at least one of the detectors, said detected value being corrected by subtracting a value derived by multiplying a predetermined coefficient and the detection values of a plurality of other detectors around said specific detector, from the output of said specific detector.

40. An electron beam apparatus as set forth in claim 36, wherein said apparatus further comprises an electron beam scanner comprising electrostatic deflection electrodes.

41. An electron beam apparatus as set forth in claim 40, wherein said electron scanner includes a mechanical scanner.

42. An electron beam apparatus as set forth in claim 36, wherein said apparatus further comprises an adjusting unit for adjusting all of or part of respective said electrode voltages.

43. An electron beam apparatus as set forth in claim 42, wherein said adjusting unit selectively adjusts the resistance of a resistor network comprising one or more resistor elements by breaking or connection of said elements.

44. An electron beam apparatus as set forth in claim 43, wherein said elements of said resistor network comprise transistors.

45. An electron beam apparatus as set forth in claim 42, wherein said apparatus further comprises an arithmetic unit for measuring fluctuation of spot diameters or deflection angles of electron beams on the basis of the signal from said detector, and calculating correction amounts for correcting all of or part of respective electrode voltages.

46. An electron beam apparatus as set forth in claim 42, that further includes a demodulator for processing information output detected by a given detector, said demodulator extracting the information based upon the backscattered or secondary electrons generated from a specific sample region by eliminating other interposed information based upon backscattered or secondary electrons generated from separate regions.

47. An electron beam apparatus as set forth in claim 36, wherein said electrode beams are modulated into pulses having mutually different pulse widths or different pulse periods.

* * * * *

UNITED STATES PATENT AND TRADEMARK OFFICE
CERTIFICATE OF CORRECTION

PATENT NO.  : 5,430,292
DATED       : July 4, 1995
INVENTOR(S) : Honjo, et al

It is certified that error appears in the above-identified patent and that said Letters Patent is hereby corrected as shown below:

Column 28, line 25, "$SS_1$ to $SS_9$" should read -- $SS_{651}$ to $SS_{659}$ --.

Signed and Sealed this

Tenth Day of September, 1996

*Attest:*

BRUCE LEHMAN

*Attesting Officer*  *Commissioner of Patents and Trademarks*

UNITED STATES PATENT AND TRADEMARK OFFICE
CERTIFICATE OF CORRECTION

PATENT NO. : 5,430,292
DATED : July 4, 1995
INVENTOR(S) : Ichiro HONJO et al.

It is certified that error appears in the above-indentified patent and that said Letters Patent is hereby corrected as shown below:

Title Page, [57] Abstract, replace the Abstract with the following
--ABSTRACT OF THE DISCLOSURE
    A pattern inspection apparatus is designed to quickly and accurately perform an inspection of an inspection sample, such as a mask or a wafer or the like by irradiating electron beams onto the inspection sample and detecting secondary or backscattered electrons reflected from the surface of the inspection sample and/or transmitted electrons passing through the inspection sample. The pattern inspection apparatus includes an electron beam generator including at least one electron gun for generating at least one electron beam irradiating onto the surface of the inspection sample. A movable support is provided for supporting the inspection sample. The apparatus also includes a detector unit having a plurality of electron detecting elements for detecting electrons containing information related to the construction of the inspection sample and a detection signal processor for processing simultaneously or in parallel formation the outputs of the electron detecting elements of the detector. Also, when a plurality of electron beams are used for simultaneous irradiation of the inspection sample, the pattern inspection apparatus is provided with a mechanism for avoiding interference between the reflected electrons of the adjacent electron beams.--

UNITED STATES PATENT AND TRADEMARK OFFICE
CERTIFICATE OF CORRECTION

PATENT NO. : 5,430,292
DATED : July 4, 1995
INVENTOR(S) : Ichiro HONJO et al.

It is certified that error appears in the above-indentified patent and that said Letters Patent is hereby corrected as shown below:

Column 4, line 16, delete "in" and substitute --is--.
Column 5, line 17, "FIGS. 30(a) ..." should start new paragraph;
  line 26, after "33(a)" insert --to--;
  line 52, "FIGS. 42(a) ..." should start new paragraph;
  line 58, "FIG. 42(c)" should not be a new paragraph.
Column 10, line 3, delete "an" and substitute --a--.
Column 11, line 39, delete "411 and 417" and substitute --$41_1$ and $41_2$00.
Column 14, line 41, delete "FIGS. 21)(a) through 21(e)" (appears twice).
Column 15, line 51, delete "21" and substitute --421--.
Column 16, line 50, delete "invention," and substitute --invention.--

Signed and Sealed this

Eighteenth Day of February, 1997

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,430,292
DATED : July 4, 1995
INVENTOR(S) : Ichiro HONJO et al.

It is certified that error appears in the above-indentified patent and that said Letters Patent is hereby corrected as shown below:

In the drawings, replace the current FIG. 38 with new FIG. 38 as follows:

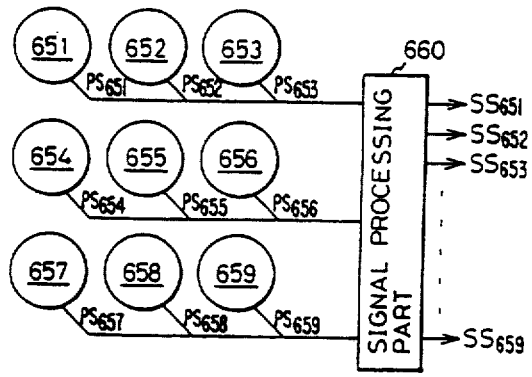

Fig. 38